(12) United States Patent  
Beerel et al.

(10) Patent No.: US 7,584,449 B2  
(45) Date of Patent: Sep. 1, 2009

(54) LOGIC SYNTHESIS OF MULTI-LEVEL DOMINO ASYNCHRONOUS PIPELINES

(75) Inventors: Peter Beerel, Encino, CA (US); Andrew Lines, Malibu, CA (US); Michael Davies, Santa Monica, CA (US)

(73) Assignee: Fulcrum Microsystems, Inc., Calabasas, CA (US)

( * ) Notice: Subject to any disclaimer, the term of this patent is extended or adjusted under 35 U.S.C. 154(b) by 222 days.

(21) Appl. No.: 11/271,323

(22) Filed: Nov. 10, 2005

(65) Prior Publication Data

US 2006/0120189 A1    Jun. 8, 2006

Related U.S. Application Data

(60) Provisional application No. 60/630,336, filed on Nov. 22, 2004, provisional application No. 60/683,397, filed on May 20, 2005, provisional application No. 60/717,073, filed on Sep. 13, 2005.

(51) Int. Cl.  
*G06F 17/50* (2006.01)

(52) U.S. Cl. ................................. 716/18; 716/2; 716/3

(58) Field of Classification Search .................. 716/18, 716/2, 3  
See application file for complete search history.

(56) References Cited

U.S. PATENT DOCUMENTS

| | | | |
|---|---|---|---|
| 4,680,701 A | 7/1987 | Cochran | |
| 4,875,224 A | 10/1989 | Simpson | |
| 4,912,348 A | 3/1990 | Maki et al. | |
| 5,133,069 A * | 7/1992 | Asato et al. | 713/401 |
| 5,212,782 A * | 5/1993 | Asato et al. | 716/6 |
| 5,367,638 A | 11/1994 | Niessen et al. | |
| 5,434,520 A | 7/1995 | Yetter et al. | |
| 5,440,182 A | 8/1995 | Dobbelaere | |
| 5,479,107 A | 12/1995 | Knauer | |
| 5,572,690 A | 11/1996 | Molnar | |
| 5,666,532 A | 9/1997 | Saks et al. | |
| 5,732,233 A | 3/1998 | Klim et al. | |
| 5,752,070 A | 5/1998 | Martin et al. | |
| 5,802,331 A | 9/1998 | Van Berkel | |
| 5,883,808 A * | 3/1999 | Kawarabayashi | 716/2 |
| 5,889,919 A | 3/1999 | Miller, Jr. et al. | |

(Continued)

FOREIGN PATENT DOCUMENTS

WO    WO9207361    4/1992

OTHER PUBLICATIONS

Heo et al., "Power-Optimal Pipelining in Deep Submicron Technology", Proceedings of the 2004 International Symposium on Low Power Electronics and Design, Aug. 9-11, 2004, pp. 218-223.*

(Continued)

*Primary Examiner*—Phallaka Kik  
(74) *Attorney, Agent, or Firm*—Weaver Austin Villeneuve & Sampson

(57) ABSTRACT

Methods and apparatus are described for optimizing a circuit design. A gate level circuit description corresponding to the circuit design is generated. The gate level circuit description includes a plurality of pipelines across a plurality of levels. Using a linear programming technique, a minimal number of buffers is added to selected ones of the pipelines such that a performance constraint is satisfied.

27 Claims, 20 Drawing Sheets

U.S. PATENT DOCUMENTS

| | | | |
|---|---|---|---|
| 5,918,042 A | 6/1999 | Furber | |
| 5,920,899 A | 7/1999 | Chu | |
| 5,949,259 A | 9/1999 | Garcia | |
| 5,973,512 A | 10/1999 | Baker | |
| 6,038,656 A | 3/2000 | Martin et al. | |
| 6,152,613 A | 11/2000 | Martin et al. | |
| 6,301,655 B1 | 10/2001 | Manohar et al. | |
| 6,381,692 B1 | 4/2002 | Martin et al. | |
| 6,502,180 B1 | 12/2002 | Martin et al. | |
| 6,910,196 B2* | 6/2005 | Cocchini | 716/6 |
| 6,950,959 B2 | 9/2005 | Davies | |
| 7,013,438 B1* | 3/2006 | Saldanha et al. | 716/2 |
| 7,050,324 B2 | 5/2006 | Cummings et al. | |
| 2003/0146079 A1 | 8/2003 | Cummings et al. | |
| 2003/0177454 A1* | 9/2003 | Kawano | 716/2 |
| 2004/0044979 A1* | 3/2004 | Aji et al. | 716/13 |
| 2004/0046590 A1* | 3/2004 | Singh et al. | 326/93 |
| 2004/0068711 A1* | 4/2004 | Gupta et al. | 716/18 |
| 2004/0117753 A1* | 6/2004 | Kahng et al. | 716/12 |
| 2004/0153984 A1* | 8/2004 | Akkiraju | 716/6 |
| 2004/0158806 A1* | 8/2004 | Scheffer | 716/11 |
| 2004/0225981 A1* | 11/2004 | Cocchini | 716/9 |
| 2006/0239392 A1* | 10/2006 | Cummings et al. | 375/372 |
| 2007/0245273 A1* | 10/2007 | Catthoor et al. | 716/2 |

OTHER PUBLICATIONS

R. O. Ozdag, P. A. Beerel. High-speed QDI asynchronous pipelines. In ASYNC'02, Apr. 2002, 10 pages.

A. M. Lines. Pipelined Asynchronous Circuits, Masters Thesis, California Institute of Technology, Jun. 1998, pp. 1-37.

A. J. Martin. Synthesis of Asynchronous VLSI Circuits. Formal Methods for VLSI Design, ed. J. Staunstrup, North-Holland, 1990, pp. 1-5,236-287.

A. J. Martin, A. Lines, R. Manohar, M. Nystrom, P. Penzes, R. Southworth, U. Cummings and T. K. Lee. The Design of an Asynchronous MIPS R3000 Microprocessor. ARVLSI'97, 1997, pp. 1-18.

U. Cummings, A. Lines, and A. Martin. An asynchronous pipelined lattice structure filter. In Proc. International Symposium on Advanced Research in Asynchronous Circuits and Systems, pp. 126-133, Nov. 1994, 11 pages.

M. Ferretti, R. O. Ozdag, P. A. Beerel. High Performance Asynchronous ASIC Back-End Design Flow Using Single-Track Full-Buffer Standard Cells. In ASYNC'04, Apr. 2004.

C G. Wong, A. J. Martin. High-level synthesis of asynchronous systems by data-driven decomposition. Design Automation Conference, Jun. 2003, 508-513.

C. G. Wong, A. J. Martin. Data-driven process decomposition for circuit synthesis. Int'l Conference on Electronics, Circuits and Systems, vol. 1, 2001, 539-546.

S. Kim, P. A. Beerel. Pipeline optimization for asynchronous circuits: complexity analysis and an efficient optimal algorithm. Int'l Conference on Computer-Aided Design, Nov. 2000, 296-302.

A. Xie. Performance Analysis of Asynchronous Circuits and Systems, Ph.D. Thesis, University of Southern California, Aug. 1999, 207 pages.

J. L. Peterson. Petri Net Theory and the Modeling of Systems. Englewood Cliffs, N.J.: Prentice-Hall, 1981, 3 pages.

T. Murata. Petri nets: properties, analysis and application, Proc. of the IEEE, vol. 77, No. 4, pp. 541-579, 1989.

J. Magott. Performance Evaluation of Concurrent Systems using Petri Nets. Information Processing Letters 18, pp. 7-13, Jan. 1984.

Ramamoorthy, C. V. and G. S. Ho. Performance evaluation of asynchronous concurrent systems using Petri nets, IEEE Trans. on Software Engineering, vol. SE-6, No. 5, pp. 440-449, 1980.

A. Dasdan. Experimental Analysis of the Fastest Optimum Cycle Ratio and Mean Algorithms. ACM Transactions on Design Automation of Electronic Systems, vol. 9, No. 4, Oct. 2004, pp. 385-418.

GLPK: GNU Linear Programming Kit package. http://www.gnu.org/software/glpk/glpk.html, 2003, updated Nov. 23, 2006, 2 pages.

GNU Linear Programming Kit Reference Manual Version 4.4, Jan. 2004, 82 pages.

R. M. Karp. A characterization of the minimum cycle mean in a diagraph. Discrete mathematics, 23:309-311, 1978.

R. Manohar and A. J. Martin. Slack Elasticity in Concurrent Computing. Proceedings of the Fourth International Conference on the Mathematics of Program Construction, Lecture Notes in Computer Science 1422, pp. 272-285, Springer-Verlag 1998.

J. Sparsø and J. Staunstrup. Delay-insensitive multi-ring structures. Integration, the VLSI journal, 15(3):313-340, Oct. 1993.

M. Greenstreet and K. Steiglitz, Bubbles Can Make Self-Timed Pipelines Fast, Journal of VLSI and Signal Processing, vol. 2, No. 3, pp. 139-148, Nov. 1990.

T. E. Williams. Self-Timed Rings and their Application to Division. PhD thesis, Stanford University, May 1991, 157 pages.

N. Shenoy. Retiming: Theory and practice. Integration, the VLSI journal, 22:1-21, 1997.

C. E. Leiserson and J. B. Saxe. Optimizing synchronous systems. Journal of VLSI Computer System, 1:41-67, 1983.

G. Strang, Linear Algebra and Its Applications, Academic Press, Inc. 1980, 5 pages.

C. H. Papadimitriou and K. Steiglitz, Combinational Optimization: Algorithms and Complexity, Dover Publications Inc, 1998, 9 pages.

Stevens et al., An Asynchronous Instruction Length Decode, Journal of Solid-State Circuit, vol. 36-2, Feb. 2001, 217-228.

Ferreti et al., Single-track Asynchronous Pipeline Templates. Dissertation. University of Southern California, Aug. 2004, 171 pages.

Davare et al., The Best of Both Worlds: the efficient asynchronous implementation of synchronous specifications. Design Automation Conference, Jun. 2004, pp. 500-513.

Cortadella et al., A concurrent model for desynchronization. Proceedings of IWLS, 2003, 10 pages.

Kondratyev, A., an Lwin, K. Design of asynchronous circuits using synchronous CAD tools., Jul.-Aug. 2002, pp. 107-117.

Alain J. Martin, Compiling Communicating Processes into Delay-Insensitive VLSI Circuits, Dec. 31, 1985, Department of Computer Science California Institute of Technology, Pasadena, California, pp. 1-16.

U.V. Cummings, et al. An Asynchronous Pipelined Lattice Structure Filter, Department of Computer Science California Institute of Technology, Pasadena, California, pp. 1-8.

Alain J. Martin, et al. The Design of an Asynchronous MIPS R3000 Microprocessor, Department of Computer Science California Institute of Technology, Pasadena, California, pp. 1-18.

Andrew Matthew Lines, Pipelined Asynchronous Circuits, Jun. 1995, revised Jun. 1998, pp. 1-37.

Alain J. Martin, Erratum: Synthesis of Asynchronous VLSI Circuits, Mar. 22, 2000, Department of Computer Science California Institute of Technology, Pasadena, California, pp. 1-143.

Venkat et al., "Timing Verification of Dynamic Circuits", May 1, 1995, IEEE 1995 Custom Integrated Circuits Conference, pp. 271-274.

Wilson, "Fulcrum IC heats asynchronous design debate", Aug. 20, 2002, http://www.fulcrummicro.com/press/article_eeTimes_08-20-02.shtml, 3 pages.

Alain J. Martin, "Asynchronous Datapaths and the Design of an Asynchronous Adder", Department of Computer Science California Institute of Technology, Pasadena, California, pp. 1-24, Oct. 1991.

Alain J. Martin, "Self-Timed FIFO: An Exercise in Compiling Programs into VLSI Circuit", Computer Science Department California Institute of Technology, pp. 1-21, 1986.

* cited by examiner

LOGIC SYNTHESIS OF MULTI-LEVEL DOMINO ASYNCHRONOUS PIPELINES

RELATED APPLICATION DATA

The present application claims priority under 35 U.S.C. 119(e) to each of U.S. Provisional Patent Applications No. 60/630,336 filed on Nov. 22, 2004, No. 60/683,397 filed on May 20, 2005, and No. 60/717,073 filed on Sep. 13, 2005, the entire disclosure of each of which is incorporated herein by reference for all purposes.

BACKGROUND OF THE INVENTION

The present invention relates to the design of asynchronous circuits and systems. More specifically, the present invention provides techniques for the synthesis and optimization of multi-level domino asynchronous pipelines.

Synchronous design using a global clock is the mainstream design style for VLSI circuits, e.g., ASICs. Implementing this methodology, however, is becoming more difficult as CMOS technology scales into deep sub-micron, and as process spread, leakage power, and wire delays are all on the rise. Consequently, the gap between full-custom and semi-custom performance is increasing, motivating the investigation of alternative methodologies. In particular, asynchronous design has been shown to dramatically improve performance because of the lack of a global clock, the ability to easily borrow time from one pipeline stage to another, and the advantages of domino logic. Moreover, asynchronous design has also demonstrated other potential benefits in terms of low power and reduced electromagnetic interference. These advantages have recently renewed interest in the development of design techniques for high-performance asynchronous circuits. However, the quality or outright lack of appropriate synthesis and optimization tools presents an obstacle to the wide spread application of such techniques.

While several approaches have been proposed for the design automation of asynchronous circuits, few have been successful in realizing the performance benefits promised by asynchronous designs.

SUMMARY OF THE INVENTION

According to embodiments of the invention, techniques for optimizing a circuit design are provided. A gate level circuit description corresponding to the circuit design is generated. The gate level circuit description includes a plurality of pipelines across a plurality of levels. Using a linear programming technique, a first number of buffers is added to selected stages of the pipelines such that the pipelines are balanced, at least one performance constraint is satisfied, and an objective function characterizing the circuit design is minimized.

According to other embodiments of the invention, a design flow is provided which enables asynchronous circuit designers to employ a conventional synchronous computer aided design (CAD) tool (e.g., tools from Synopsys or Cadence) and transform the gate-level result into a multi-level domino logic asynchronous design. According to specific embodiments, methods and apparatus are provided for synthesizing a circuit which includes asynchronous logic from a netlist generated by a synchronous computer-aided design tool. Synchronous logic gates represented by the netlist are converted to asynchronous logic gates. Clock circuitry represented by the netlist is replaced with asynchronous control circuitry and completion control circuitry thereby generating a plurality of asynchronous pipelines including the asynchronous logic gates. A plurality of buffers corresponding to a specific design template is inserted into selected ones of the asynchronous pipelines to normalize path lengths through the asynchronous pipelines thereby achieving a level of performance. Selected ones of the buffers are removed in a manner dependent on the specific design template to reduce overhead associated with the asynchronous logic with substantially no impact on the level of performance.

A further understanding of the nature and advantages of the present invention may be realized by reference to the remaining portions of the specification and the drawings.

DETAILED DESCRIPTION OF SPECIFIC EMBODIMENTS

Figure 1A:
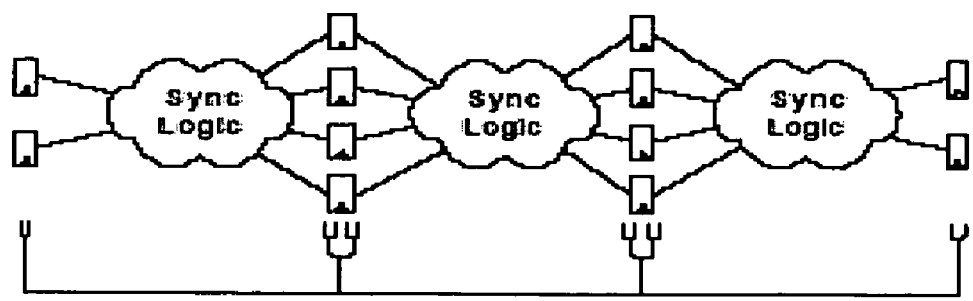
FIG. 1 includes simplified diagrams contrasting a traditional synchronous circuit and a circuit having asynchronous portions.

Reference will now be made in detail to specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, specific details are set forth in order to provide a thorough understanding of the present invention. The present invention may be practiced without some or all of these specific details. In addition, well known features may not have been described in detail to avoid unnecessarily obscuring the invention.

Currently there are no commercially available design tools specifically intended for asynchronous circuits. That is, asynchronous circuits are typically designed using fully custom flows. Specific embodiments of the present invention enable asynchronous circuit designers to employ conventional synchronous design tools (e.g., such as those available from Synopsys or Cadence) and then transform the gate-level result into an asynchronous design based on multi-level domino logic. According to specific embodiments, synchronous logic (represented by a netlist generated using a synchronous CAD tool) is transformed to domino logic, adding asynchronous control and completion detection, and performing slack matching to optimize the design.

According to various implementations, transformation techniques implemented according to the present invention may be integrated with synchronous CAD tools to varying degrees. That is, for example, the synchronous CAD tool may be employed up until the point at which a synchronous netlist is generated with all steps of the subsequent transformation being conducted outside of the synchronous tool in an independent translator CAD environment. Such an approach is advantageous in that no augmentations or special features need to be introduced into the synchronous CAD tool. In addition, this enables the technique to be simultaneously compatible with a variety of synchronous CAD tools. Alternatively, at least some of the transformation may be conducted within the synchronous CAD tool environment by leveraging exposed APIs to provide extensions which are operable read the tool's database and perform the transformations described herein.

In addition, as will become clear, the slack matching techniques described herein are not limited to the logic synthesis techniques described herein. That is, the slack matching techniques described herein may be applied in a wide variety of contexts to optimize asynchronous circuit designs. Broadly speaking, slack matching takes a gate level circuit (not necessarily multi-level domino logic) and creates an optimization problem which, subject to some set of constraints, generates a slack-matched circuit (i.e., a circuit in which pipelines in a given level are balanced) with a minimum number of additional buffers. According to specific implementations, the optimization problem is solved using linear programming (LP) or mixed integer linear programming (MILP) solutions. As a first pass, buffers are added so that the length of the different paths through a given level are equal. Then, unnecessary buffers are removed while ensuring that there are no "wire throughs." The LP/MILP approach to slack matching described herein is to be contrasted with so-called "branch and bound" algorithms which have been used to optimize asynchronous circuits, but are too computationally expensive for large circuits. The LP/MILP techniques described herein are less computationally expensive because, while "branch and bound" algorithms are exponential algorithms, LP/MILP algorithms may be accomplished, in some cases, in polynomial time.

Specific embodiments of the present invention will now be described which apply synchronous logic synthesis tools to produce multi-level domino asynchronous pipelines. Initially, standard logic synthesis tools are applied to a standard register transfer language (RTL) specification using a special image library comprising single-rail gates with timing arcs corresponding to their dual-rail equivalents. Slack matching is applied to produce a levelized single-rail netlist. The levelized single-rail netlist is translated into a dual-rail multi-level domino circuit by expanding each single-rail gate into its dual-rail equivalent, and adding pipeline control.

Synchronous RTL specifications are useful in that they allow designers to ignore timing when considering system function. The resulting circuits are generally small and efficient, but due to the limitations of static CMOS circuits have limited performance. Asynchronous circuits such as dual-rail domino pipelines offer higher performance, but must properly order the sequence of pre-charge and evaluate phases of each stage. A specific embodiment of the invention strikes a balance between these benefits of synchronous and asynchronous circuits.

Figure 1B:
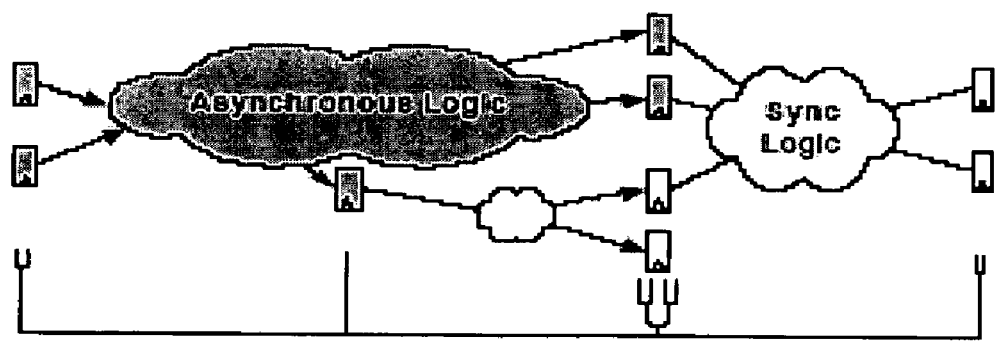

FIG. 1 illustrates the contrast between a standard flip-flop-based ASIC and an enhanced circuit where some portions are implemented inside an asynchronous circuit. In a classic synchronous circuit, combinational static logics are bounded by flip-flops driven with clock-trees as shown in FIG. 1(a). This circuit, therefore, should be defined for worst-case conditions considering process variations, IR-drop, and cross-talk. In contrast, the asynchronous circuit of FIG. 1(b) spans multiple flip-flops, enabling implicit clock borrowing across multi-cycle paths and useful skew. Moreover, lower power for the same performance can be achieved as large portions of the clock-tree are eliminated. As shown in FIG. 1(b), the boundaries between asynchronous and synchronous designs are implemented with special synchronous-to-asynchronous (S2A) and asynchronous-to-synchronous (A2S) circuits. The S2A circuits transform synchronous wires to the asynchronous protocol using the global clock as reference to toggle the data lines. Similarly, the A2S circuits convert dual-rail wires back into single-rail representation, and produce error signals if the asynchronous logic is not valid sufficiently before the clock arrives.

Figure 2:
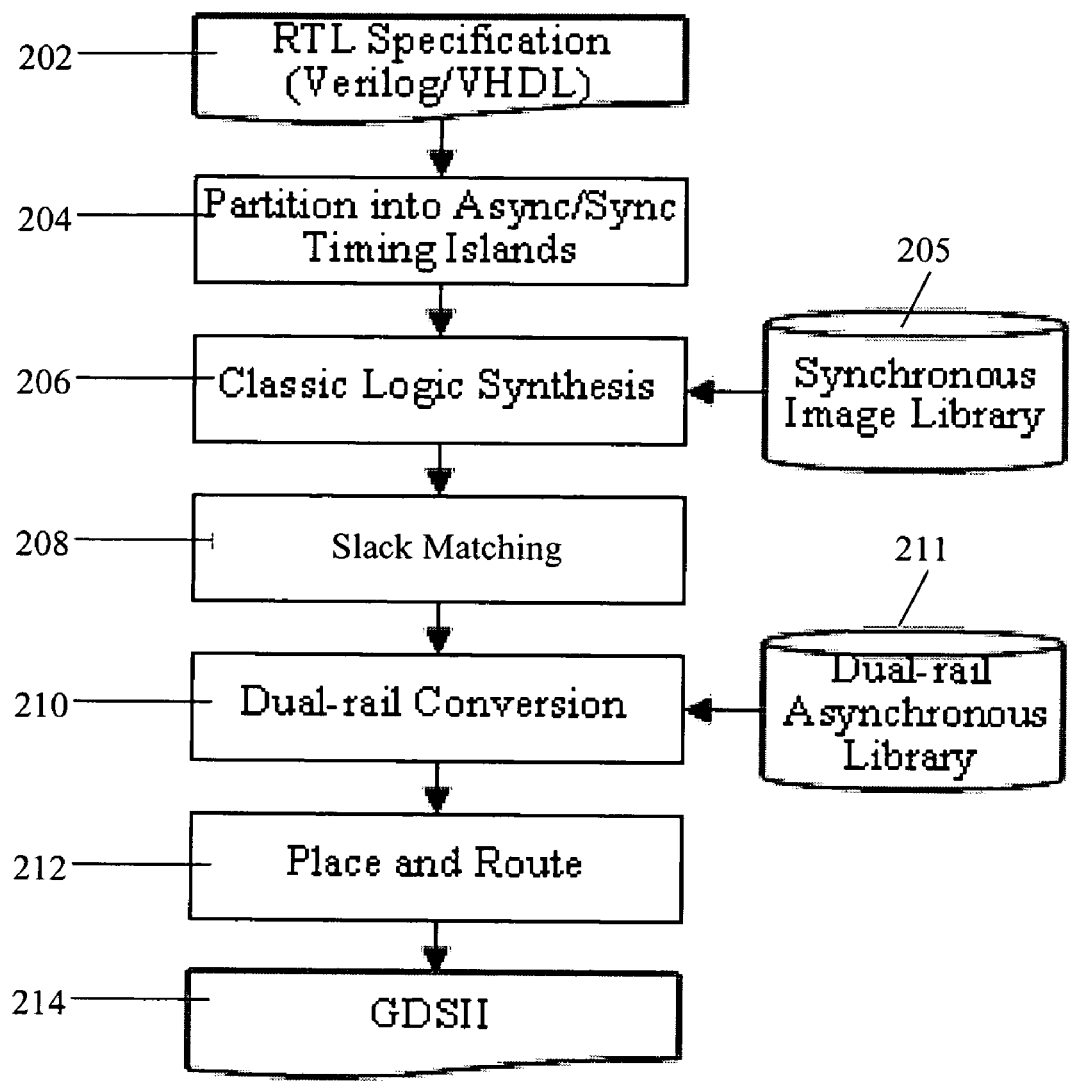
FIG. 2 is a flowchart illustrating a specific logic synthesis flow for asynchronous circuits according to a particular embodiment of the invention.

The starting place of a design flow in accordance with a specific embodiment of the invention is the same as many synchronous design flows as illustrated in FIG. 2. The input of this flow is the RTL specification, e.g., in VHDL or Verilog code (202). During partitioning (204), logics that should be asynchronous are identified. Using a standard cell library (205), a commercial synthesis tool performs HDL optimizations during classic logic synthesis (206). To translate the synchronous circuits into asynchronous circuits, one form of slack matching (208), also referred to herein as levelization, and dual-rail conversion (210) is performed. In slack matching, levelization is performed to ensure that there are no pipeline stages that have thru-wires. This involves the addition of a minimum number of buffers to the design. In the dual rail conversion, the single-rail netlist is expanded into a dual-rail multi-level domino netlist by replacing each single-rail gate with its dual-rail equivalent.

According to a specific embodiment, a single-rail image of a dual-rail library of gates is generated and used with a conventional synchronous logic synthesis technique. To create a gate image, map dual-rail timing arcs are mapped to synchronous equivalents, taking the maximum of multiple dual-rail arcs where necessary. This mapping is described in further detail below.

Figure 3:
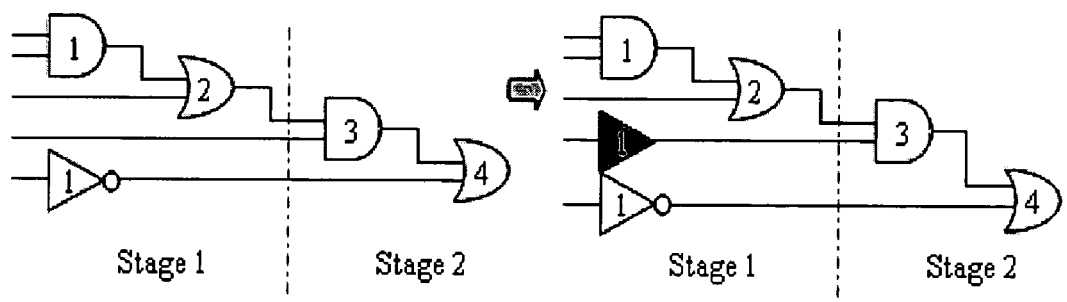
FIG. 3 is a simplified logic diagram illustrating levelization according to a specific embodiment of the invention.

During levelization, the maximum distance to all of the loads for each output pin of a gate is calculated and a buffer chain with one buffer per stage is generated to create a fully balanced pipeline. FIG. 3 illustrates an example of the levelization. The number in each gate is the maximum depth (level) from the primary inputs, and the levels per stage is two. In this example, the inputs of the AND gate that has depth 3 have different levels, i.e., a level 2 OR gate and a level 0 primary input.

A pipeline is a linear sequence of functional stages where the output of one stage connects to the input of the next stage. For synchronous pipelines, the tokens usually advance through one stage on each clock cycle. For asynchronous pipelines, there is no global clock to synchronize the movement. Instead, each token moves forward down the pipeline when there is an empty cell in front of it. Otherwise, it stalls. A deterministic pipeline is generally partitioned into a set of stages each controlled by a different control signal. In order to ensure correct operation, it is necessary to insert buffers along paths that would otherwise constitute a wire going through an entire pipeline stage. In FIG. 3, therefore, a buffer is added in stage 1 from a primary input (level 0) to the level 3 AND gate in stage 2 to balance the pipeline and ensure correct operation.

According to various embodiments of the invention, slack matching is used to analyze logic gates and identify which paths (also referred to herein as channels), if any, need additional buffers (dynamic slack). Many approaches recently proposed for slack matching are applicable only to linear structures even though real systems typically have nonlinear structures such as fork-join and loop structures in their systems. One implementation of the present invention counts stages and makes sure they always match up along forking and rejoining paths, and around state loops.

According to this implementation, it is assumed that a circuit does not have any handshake bottlenecks to begin with and all channels are unconditional, which may over-slack-match cells with conditional channels. All cell types in the hierarchy are processed, adding the minimum amount of slack to each local channel. The cell types are processed from the lowest level to the highest. Extensions to handle conditional behaviors are described below.

As each cell is processed, the sub-cells and channels are used to formulate a linear programming problem which minimizes the total cost of additional slack subject to constraints on the timing of all channels. For a linear programming solver, the constraints on each channel are as follows:

$$(dstCell.time+dstTime)-(srcCell.time+srcTime)=slack \quad (Eq.1),$$

where dstCell.time, srcCell.time, and slack are independent variables, and dstTime and srcTime are constant time offsets specified on the ports of leaf cells. In addition, all primary inputs and outputs are constrained to have the same time stamp which is necessary to ensure the result can be mapped to a multi-level domino pipeline as discussed below. For each mid-level cell in the hierarchy, the time offset (in stages) of all input and output ports and slack depth, the number of stages between the earliest input and the latest output, which is the longest latency of the cell, are generated by slack matching.

If a channel generates tokens after reset (i.e., a Token Buffer), this is declared with 'initial_tokens'. Channels with initial tokens are treated as if they have a latency of '-cycle$_{13}$ slack*initial_tokens', since the first output token actually leaves before the first input token arrives.

The slack helps identify the number of buffers that must be added to the channel to achieve the target cycle time subject to the specific asynchronus design template. In the multi-level domino style, the restriction is that no feed through wires in a pipeline stage are allowed. Thus, for each non-zero slack that spans a pipeline stage, one buffer is needed to be added in that pipeline stage.

Moreover, in the multi-level domino pipeline, channels can share buffers, unlike in other channel-based design styles, including those consisting of half and fill-buffers described later in this document. In particular, if two channels need slack eminating out of one gate, the slack required in these channels can share the same buffers. In particular, a chain of buffers can be created and forked off to different fanouts depending on how much slack is needed to that fanout.

Figure 4:
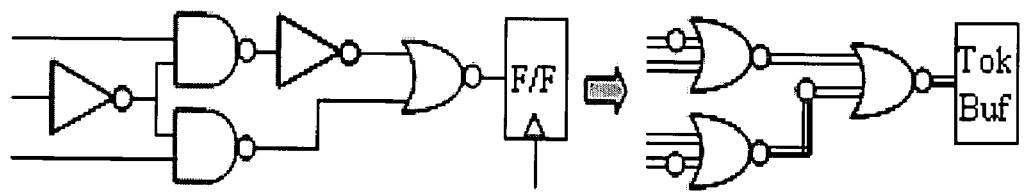
FIG. 4 is a simplified diagram illustrating translation of synchronous logic to asynchronous logic according to a specific embodiment of the invention.

The basic idea for dual-rail conversion is that every single-output combinational gate is translated to an equivalent dual-rail gate as illustrated by the example in FIG. 4. Each single-wire is translated to a dual-rail wire, combinational inverters are implemented by simply twisting the associated dual-rail wires, and combinational gates are replaced with asynchronous dual-rail version. Flip-flops are translated into Token Buffers (TokBuf) which are modified pipeline buffers that insert a token into the system upon reset. Each slack buffers get replaced with a simple dual-rail buffer.

The asynchronous library can be quite small because inverters on the inputs and outputs come for free so that many gates typical in a synchronous library need no counterpart in the asynchronous library. For example, NAND gates in FIG. 4 are the non-canonical versions of NOR so that they can be replaced with dual-rail NOR gates with twisted inputs and an inverted output. Similarly, XNOR can be replaced with dual-rail version of XOR. Considering logical equivalents, the total number of 2-input dual-rail logic gates which need to be supported is only 2, i.e., NOR and XOR gates. NAND, AND, OR and other gates are the non-canonical versions of NOR, and XNOR is the non-canonical one of XOR gate.

Figure 5:
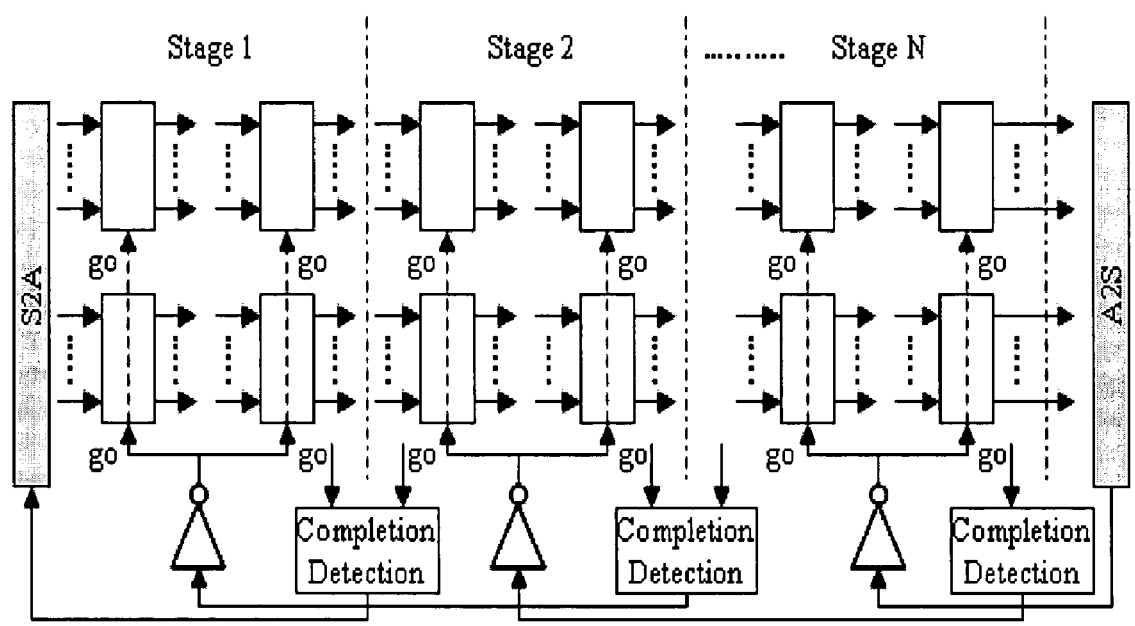
FIG. 5 is a diagram of an exemplary multi-level domino pipeline.

FIG. 5 illustrates a multi-level domino asynchronous pipeline. The completion detection comprises a pre-charged logical AND tree shown in FIG. 6 which is used for signal validity and neutrality between pipeline stages. The output of the completion detection in stage N acts as an enable signal (go) for stage N−1 through an inverter. During dual-rail conversion, each gate is converted to dual-rail (DR) gates when driving gates in the same stage. Alternatively each gate is converted to dual-rail gates with an additional completion port for detecting output changes (DR_NAND) when driving gates in a different stage Assuming the number of levels of logic per pipeline stage is 2 as shown in FIG. 5, the second gates on each stage are DR-NAND gates, and the changes of the output of the DR_NAND gates are detected in 'Completion Detection' (CD). It should be noted that the pipeline style shown in FIG. 5 is merely exemplary and that a wide variety of other pipeline styles may be employed with various embodiments of the invention.

Figure 6A:
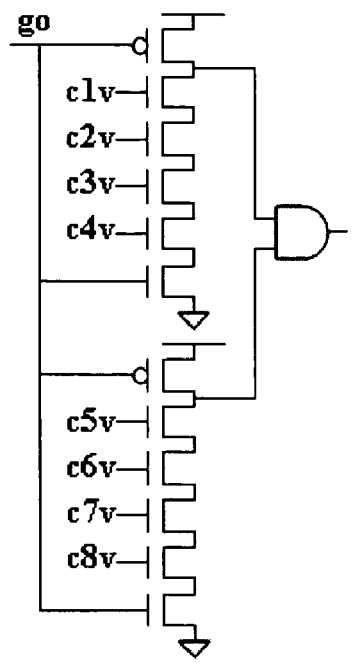
FIG. 6 includes diagrams of an implementation of completion detectors according to a specific embodiment of the invention.
Figure 6B:
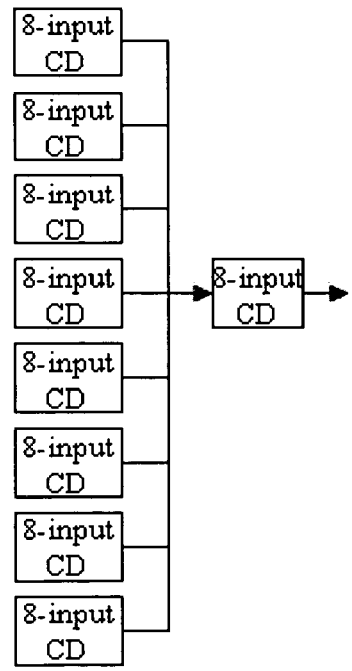

The Completion Detection circuits make a tree of AND gates using 8-input trees as shown in FIG. 6(a). All the outputs of the DR_NAND gates in each stage are connected to the AND trees, and more CD trees can be added with little increase in the cycle time. For example, a 64-input CD in which each box represents an 8-input CD can complete up to 64-bits in just 4 transitions (see FIG. 6(b)).

Thus, specific embodiments of the present invention provide an efficient logic design flow for asynchronous circuits supported by commercial CAD tools, e.g., tools from Cadence, Synopsys, Magma. Synchronous circuits are translated into asynchronous circuits after logic synthesis using any of the well-known logic synthesizers. Slack matching is applied for the levelized pipeline which is then expanded into dual-rail multi-level domino circuits.

According to various embodiments, a variety of approaches to slack matching may be employed. According to one set of embodiments, a mixed integer linear programming (MILP) solution is employed. It should be noted that, while the ILP solution described herein may be used with the logic synthesis technique described above, it is not limited to that technique. To the contrary, the slack matching technique described below is widely applicable and may be employed in the context of a wide variety of asynchronous and more generally, latency-insensitive design flows. The class of asynchronous designs particularly useful are those slack-elastic designs in which the addition of pipeline buffers does not affect functional correctness.

As described above, slack matching is the problem of adding pipeline buffers to an asynchronous pipelined design in order to prevent stalls and improve performance. The MILP solution described below addresses the problem of minimizing the cost of additional pipeline buffers needed to achieve a given performance target.

According to one set of embodiments, the asynchronous design style context of this sizing tool is characterized by the communication of data between blocks via channels instead of by clocking data into shared registers. Data wires run from the sender to the receiver, and an enable (an inverted acknowledge) wire goes backward for flow control. A four-phase handshake between neighboring blocks (processes) implements a channel. The four phases are in order: 1) Sender waits for high enable, then sets data valid; 2) Receiver waits for valid data, then lowers enable; 3) Sender waits for low enable, then sets data neutral; and 4) Receiver waits for neutral data, then raises enable.

The asynchronous design style is further characterized by the partitioning of asynchronous datapaths into bit-slices and pipelining between bit-slices to achieve higher throughput. It employs a set of leaf cell template that are the smallest components that operate on the data sent using the above asynchronous handshaking style and are based upon a set of design templates with low latency and high throughput. Examples of such leaf cell templates include the Precharged Half-Buffer (PCHB), the Weak-Condition Half Buffer (WCHB), and the Precharged Full Buffer (PCFB). These templates all have one or two completion detection units, domino logic for the computation of output data, and asynchronous control circuitry dictating when to pre-charge/evaluate the domino logic and when to raise and lower the enables for the input channels. Each leaf cell may operate on 1-8 bits of data and when combined with standard pipelining between functional boundaries, this creates a complex 2-dimensional pipeline which must be balanced to guarantee optimal performance.

For further detail regarding this design style and these templates please refer to the following papers: A. J. Martin, "Compiling Communicating Processes into Delay-Insensitive Circuits," *Distributed Computing*, Vol. 1, No. 4, pp. 226-234, 1986; U. V. Cummings, A. M. Lines, A. J. Martin, "An Asynchronous Pipelined Lattice Structure Filter." *Advanced Research in Asynchronous Circuits and Systems*, IEEE Computer Society Press, 1994; A. J. Martin, A. M. Lines, et al, "The Design of an Asynchronous MIPS R3000 Microprocessor." *Proceedings of the 17th Conference on Advanced Research in VLSI*, IEEE Computer Society Press, 1997; and A. M. Lines, "Pipelined Asynchronous Circuits." *Caltech Computer Science Technical Report* CS-TR-95-21, Caltech, 1995; the entire disclosure of each of which is incorporated herein by reference for all purposes. See also U.S. Pat. No. 5,752,070 for "Asynchronous Processors" issued May 12, 1998, and U.S. Pat. No. 6,038,656 for "Pipelined Completion for Asynchronous Communication" issued on Mar. 14, 2000, the entire disclosure of each of which is incorporated herein by reference for all purposes.

It should also be understood that the various embodiments of the invention may be implemented in a wide variety of ways without departing from the scope of the invention. That is, the processes and circuits described herein may be represented (without limitation) in software (object code or machine code), in varying stages of compilation, as one or more netlists, in a simulation language, in a hardware description language, by a set of semiconductor processing masks, and as partially or completely realized semiconductor devices. The various alternatives for each of the foregoing as understood by those of skill in the art are also within the scope of the invention. For example, the various types of computer-readable media, software languages (e.g., Verilog, VHDL), simulatable representations (e.g., SPICE netlist), semiconductor processes (e.g., CMOS, GaAs, SiGe, etc.), and device types (e.g., FPGAs) suitable for the processes and circuits described herein are within the scope of the invention.

Figure 7:
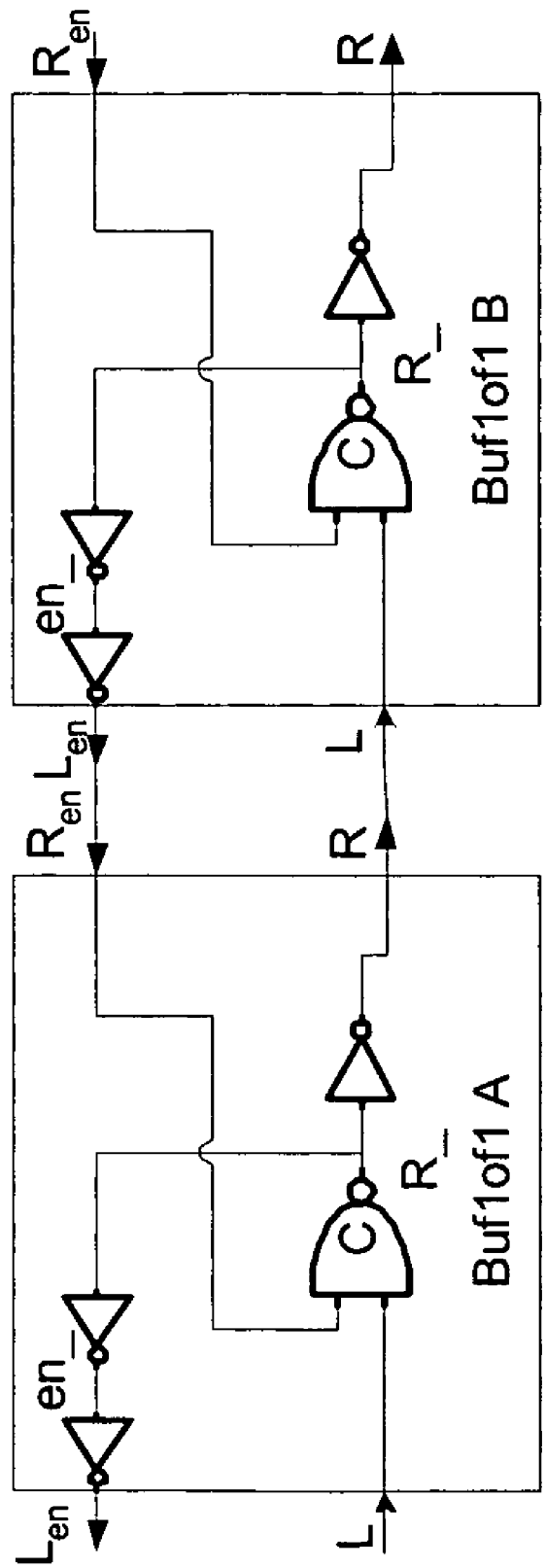
FIG. 7 depicts exemplary leaf cells connected in series in a mid-level cell.

This task of balancing pipelines is complicated because the designs are often organized and layed out hierarchically to manage complexity. A very simple WCHB buffer is a buf1of1 which pipelines a simple synchronization channel. Its input channel data (enable) is L (Len), while the output channel data/enable is R (Ren). FIG. 7 shows two buf1of1 leaf cells connected in series in a mid-level cell. This template is referred to as a half-buffer because tokens cannot reside in both input and output channels simultaneously. That is in a linear pipeline of N half-buffers a maximum of N/2 tokens can reside. Full-buffers in contrast can simultaneously have tokens on both inputs and output channels and consequently a pipeline of N full-buffers holds a maximum of N tokens.

The performance a leaf cell can be measured in terms of latency and local cycle time. The latency of a leaf-cell is the delay through the leaf cell when the output channel is empty. For a buf1of1 circuit the latency is through the C-element and inverter and can be approximated as two gate delays. When several leaf cells form a linear pipeline the throughput of the system is the reciprocal of the worst-case cycle time of any set of neighboring leaf cells. In particular, the handshaking protocol between neighboring leaf cells dictates the frequency that the leaf cells can generate new tokens and is referred to as the local cycle time. In particular, typical leaf-cells have local cycle times of 6-18 transitions depending on the specific leaf-cell template and the amount of processing the leaf-cell implements. It is important to note that unlike in synchronous systems, the local cycle time is often larger than the latency of a given leaf-cell as it takes some time for the handshaking protocol to reset. In particular, typical leaf cells have a forward latency of only 2 transitions. The difference between the local cycle time and the forward latency is often referred to as the backward latency.

In non-linear pipelines leaf cells can have more than one input and output channels. Fork stages have multiple output channels and join stages have multiple input stages. In a join stage, the leaf cell waits for all tokens to arrive before generating the output tokens and thus acts as a synchronization point. A non-linear pipeline stage is unconditional if it reads a token from every input channel and generates a token on every output channel in every cycle. It is conditional otherwise, that is, if it can read a subset of input channels or generate tokens on a subset of output channels depending on local state or the token value read among other channels.

To gain intuition to the slack matching problem, consider the special homogeneous case that all leaf-cells have the same latency $l_c$ and local cycle time $\tau_c$ and the goal is to obtain a global cycle time that is equal to the local cycle time. This will then be generalized this to the non-homogeneous case.

A key observation is that if tokens arrive at a join stage at different times, the early token will stall and the stall will propagate backwards and slow the entire system down. This may be illustrated with the classic unbalanced fork-join pipeline structure shown in FIG. 8 in which each leaf-cell is a full-buffer, has a cycle-time of 10, and a forward latency of 2. Stage 0 is a token buffer and generates tokens to both of its output channels upon reset. The unbalanced nature of the pipeline causes the first token processed by the top "short" fork to stall for 4 time units while waiting for the lower "longer" fork to propagate its first token. With a backward latency of 8, the output channel can accept a second token no sooner than t=16. This means that the second token that arrives at the input channel of stage 5 is stalled for 4 time units during this reset period. This stall delays when the third token arrives at stage 1 by 4 time units. This sequence of stalls continues and every other token processed by every channel is delayed by 4 time units. Consequently, instead of each channel operating at a peak local cycle time of 10 time units, they all operate at an average cycle time of 12 time units. The intuition gained from this example is as follows: in the homogeneous case, for the global cycle time to equal the local cycle time, all tokens must arrive at all join stages at the same time.

Figure 9:
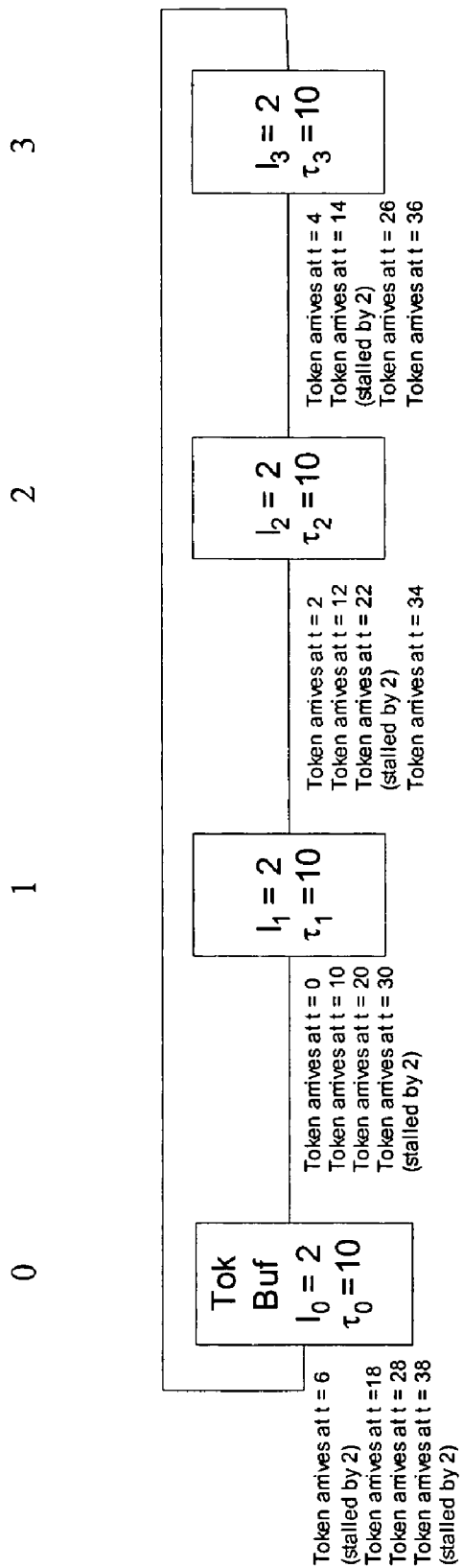
FIG. 9 is a flow diagram illustrating the operation of a homogeneous bubble-limited ring.

This intuition is a necessary condition for the global cycle time to be equal to the local cycle of the channels. It is not however sufficient. To see this, consider another important case when a token can propagate around a loop of leaf cells faster than the local cycle time. In this case a token will be stalled while the local channel resets. Like the above case, this stall will propagate backward and increase the global cycle time. In particular, it is the backward propagation of empty places for tokens to move into (so called bubbles) that becomes the throughput bottleneck. As an example, consider the simple 4-stage ring illustrated in FIG. 9. The first token, after propagating through the ring, is stalled at stage 0 while stage 0 completes its reset cycle. Then, the second token is stalled at stage 3, the third token is stalled at stage 2, and the fourth token is stalled at stage 1. In fact, for every channel, every $3^{rd}$ token is stalled by 2 time units. This yields an average cycle time of 10⅔, which is ⅔ time units larger than the local cycle time of 10.

Alternatively, if the latency around a one-token-loop is larger than τ, the cycle time will necessarily be greater than τ. Consequently, another necessary condition is that for one-token loops the propagation delay along every cycle is equal to local cycle time. Multi-token loops, with multiple token buffers, yield a generalization of this condition. Specifically, for the global cycle time to equal the local cycle time, the latency along any m-token-loop must be m τ.

Together these two conditions are necessary and sufficient under a reasonably general performance model.

Now consider the case in which one channel can reset faster than others, i.e., it has a smaller backward latency. If a token is stalled in this channel by a small amount, the channel may still be able to reset in time to accept the next token within the desired global cycle time. If the forward latency+ stall time+backward latency=the desired global cycle time, then this stall will not bottleneck the design. Consider the modified fork-join example in FIG. 10. Here stage 5 has a cycle-time of 6 which is by convention associated with its output channel. In most templates the cycle time of a channel depends on both the leaf-cells at the sending and receiving ends of the channel, but for simplicity, the channel cycle time has been associated with only the sender. Consequently, despite the output channel being stalled for 4 time units it is always reset in time to not stall the input tokens to stage 5. For example, the first token arrives at time t=2, it is stalled for 4 time units waiting for the other token to arrive at the join stage (stage 4). Thus at t=6 it is consumed and because of the cycle time of 6 it can accept a new token at time t=12, which means that the token that arrives at t=10 at the input to the stage 5 is never stalled. As a consequence, every channel has a cycle time of 10 which equals the local cycle time and optimum performance is achieved. We call the difference between desired global cycle time and the local cycle time free slack. Notice that this is the same case as when the desired global cycle time is larger than the homogeneous local cycle time in that all channels have free slack.

Figure 11:
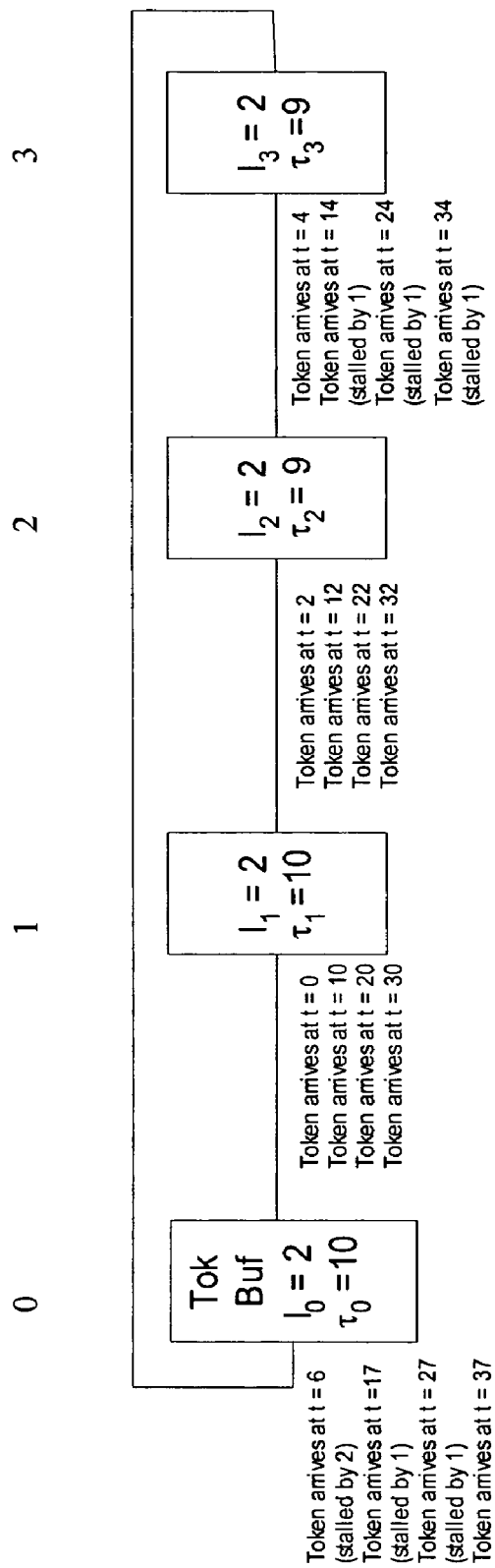
FIG. 11 is a flow diagram illustrating the benefits of free-slack in a ring.

In addition, to meet the desired global cycle time, stalls caused by the backward propagation of bubbles must be less than the sum of the free slack around the cycle. To illustrate this, consider the modified 4-stage ring in FIG. 11 in which two stages have slightly faster local cycle times of 9, the sum of which is equal to the stall observed in the bubble-limited ring illustrated in FIG. 9. As illustrated, the faster channels are able to absorb the stalls and the result is that all channels have an average cycle time of 10. That is, the global cycle time equals the worst-case local cycle time, and the optimum performance is achieved.

While there is no way to avoid long latency loops, in all remaining cases, the throughput of the design can be increased by adding pipeline buffers to the system such that tokens and bubbles are not overly stalled.

The following description introduces a mixed integer-linear programming (MILP) framework which may be used to solve the slack-matching problem for non-hierarchical systems as well as extensions to support hierarchy.

The general approach of the MILP is to constrain the relative timing of arrival times of tokens at leaf-cells and allow pipeline buffers to be added to channels that effectively increase the latency between leaf cells in terms of added latency and free-slack. The cost of the added slack can then be minimized subject to these constraints as follows:

Minimize sum $c(s_{ij})$ $s_{ij}$ subject to

Channel constraints $a_j = a_i - m\tau + f_{ij} + l_c + l_s s_{ij}$ for all channels c between leaf cell instances i and j, Free slack constraints $f_{ij} \leq \tau - \tau_{ij} + s_{ij}(\tau - \tau_s)$ for all channels c between leaf cell instances i and j, Variable bounds and integral constraints $a_i \geq 0$ for all associated transitions $t_i$, $f_{ij} \geq 0$ and $s_{ij} \in \aleph$ for all channel c between leaf cell instances i and j, Where $l_{ij}$, $\tau_{ij}$, and $f_{ij}$ are the latency local cycle time, and free slack of channel c between leaf cell instances i and j; $a_i$ are free variables representing the arrival time of tokens at leaf cells, where there are as many ai variables as leaf-cell instances; $s_{ij}$ are independent variables that identify the amount of slack added to channel c between leaf cell instances i and j; $l_s$ and $\tau_s$ is the latency and local cycle time of a pipelined buffer; m=1 if this channel upon reset has a token and 0 otherwise; and $c(s_{ij})$ represents the cost of one pipeline buffer added to channel c between leaf cell instances i and j.

The channel constraints guarantee that the density of data tokens along a loop of leaf cells is sufficiently low such that no token is stalled waiting for any channel to reset and that the latency along the loop is not too high such that leaf cells are never starved. In particular, for any loop of leaf cells, the equations guarantee that the latency+free slack around the loop is equal to the number of tokens in the loop times the desired cycle time as calculated by the sum of m τ along the loop. Because the free slack is greater than 0, the equations are not feasible in the case that the throughput is less than τ, as expected. In addition, the constraints guarantee that the sum of the free-slack along the short path of a fork-join path is sufficient to balance the two paths. Notice that the free-slack of a channel, as constrained by the free-slack constraints, is upper bounded by the sum of two components. The first of the two components is the free-slack associated with the difference in the cycle time of the channel and the target cycle time, $\tau-\tau_c$. The second component of the free-slack is the slack obtained by adding $s_{ij}$ number of pipeline buffers, each contributing $\tau-\tau_s$ amount of slack. Note that we restrict $s_{ij}$ to be integral because there is no such thing as a fraction of a pipeline buffer that can be added to a channel. Finally, note that $c(s_{ij})$ may depend on the physical size of the pipeline buffer and/or the width (i.e., number of rails) of the channel.

As an example, the MILP for the non-homogeneous fork-join pipeline is as follows:

Minimize $c(s_{0a})+c(s_{0b})+c(s_1)+c(s_2)+c(s_3)+c(s_4)+c(s_5)$ subject to $a_1=a_0-8+2\,s_{0a}$ $a_5=a_0-8+2\,s_{0b}$ $a_2=a_1+2+2\,s_1$ $a_3=a_2+2+2\,s_2$ $a_4=a_3+2+2\,s_3$ $a_4=a_5+2+f_5+2\,s_5$ $a_0=a_4+2+2\,s_4$ $4 \geq f_5 \geq 0$ One optimal solution to this MILP is a=[8 0 2 4 6 0], $f_5$=4, and s=[0 0 0 0 0 0] with a cost of 0. That is, no slack is needed in this example, consistent with the intuitive explanation above.

Figure 12:
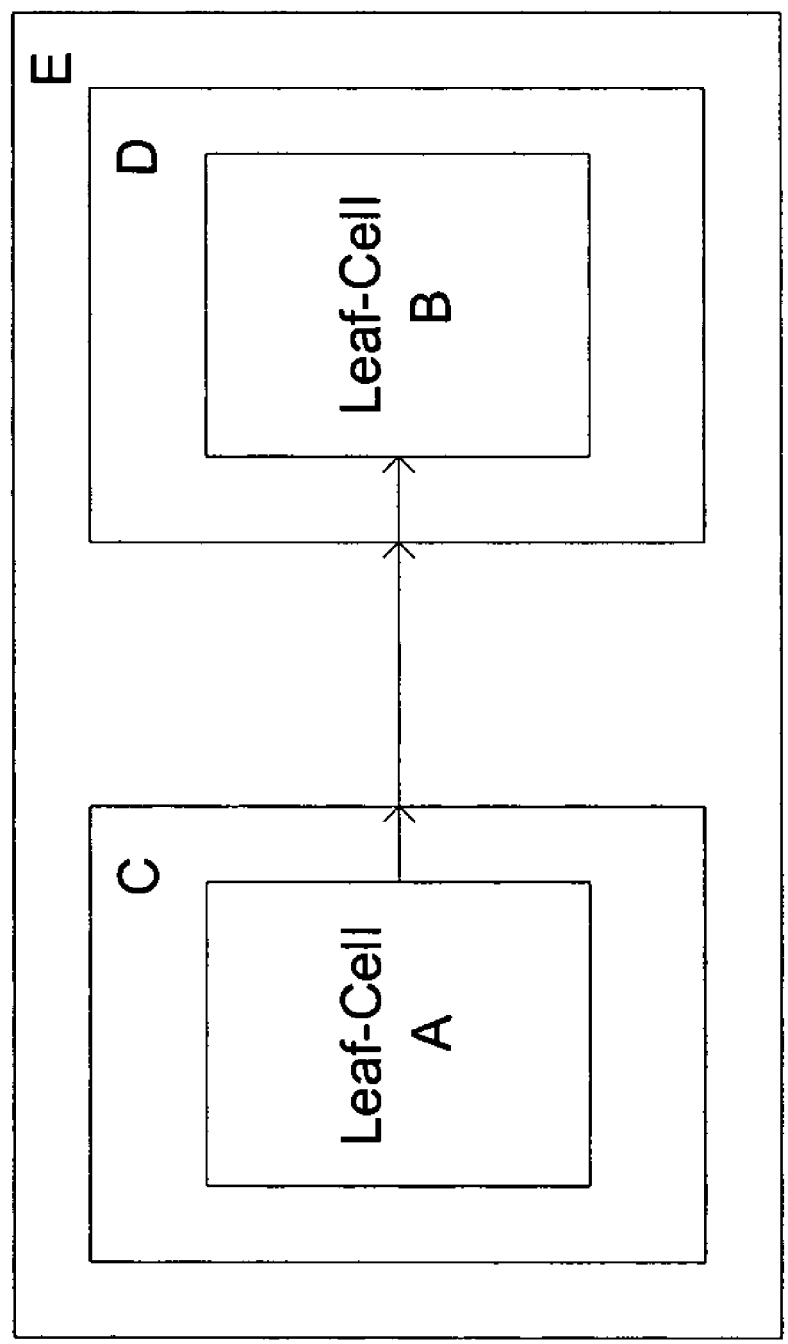
FIG. 12 is a simplified representation of a design hierarchy for illustrating multiple locations of pipeline buffer insertion.

In the example illustrated in FIG. 12, there are three locations, within mid-level cells C, D, or E, in which pipeline buffers may be added. In the above MILP formulation, the $s_c$ associated with the channel between leaf-cells A and B identifies the slack that would be added to cell E, that is to the highest cell in which the channel is internal. This approach guarantees sub-cells have the least amount of slack which optimizes re-use. Alternatively, $s_c$ can be decomposed into a set of independent variables one for each possible location of the pipeline buffers, i.e., within mid-level cells C, D, or E. The choice of how many pipeline buffers should be added in each of these three locations depends on the environments of the other instances of leaf-cells A and B. This decomposition does not affect the total number of pipeline buffers needed in an optimal design, but may be beneficial if the cost function for the MILP included the design cost associated with each unique buffer in each leaf cell type (rather than simply the area cost associated with each pipeline buffer instance).

In either case, the set of free variables in the MILP includes one slack variable for each unique location that slack can appear in the hierarchical design and one time variable for each leaf-cell instance. There is also one channel and free-slack constraint for each channel instance. The channel constraints are instance based rather than type based because the timing of different instances of the same type of leaf-cell will often be very different. In addition, the free-slack constraint is instance specific because the amount of slack each channel needs to absorb may also vary from instance to instance.

Figure 13:
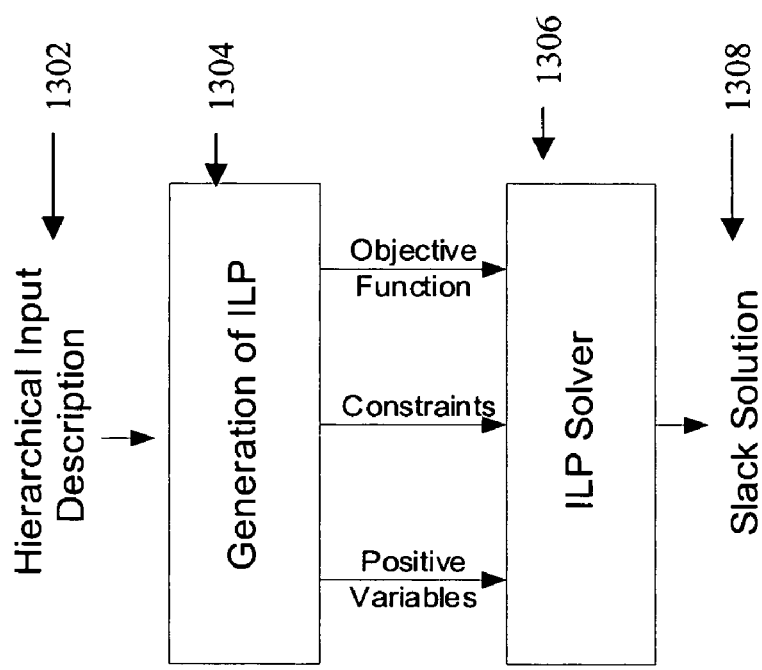
FIG. 13 is a flow chart representing a slack-matching tool designed according to a specific embodiment of the invention.

Referring now to the flowchart of FIG. 13, the slack matching tool reads in a hierarchical description of the design (1302) in which leaf-cells, mid-level cells, and the channels that connect them as input are well identified. In addition, the channels are annotated with the cycle times they achieve. The slack matching algorithm takes this circuit description as input, along with the target cycle time, generates the MILP formulation described above (1304) and sends it to a general purpose MILP solver (1306). The result of the MILP solver then identifies where the designer should add slack (1308).

There are many formats for which MILP problems can be defined, including CPLEX LP and MPS formats. CPLEX LP has a variety of key words, including minimize and subject to with their standard meanings that makes specification of the MILP problem natural. Pseudo-code that takes as input a hierarchical design and writes out the CPLEX LP formulation of the MILP problem as follows.

```
WriteILP(design, CPLEXfile) {
    WriteObjFunction(design,CPLEXfile);
    WriteConstraints(design,CPLEXfile);
}
WriteConstraints(design,CPLEXfile) {
    allChannels = design.getAllChannelInstances( );
    CPLEXfile.write("subject to\n");
    foreach (channel chan in allChannels) {
        // emit channel constraint a_i = a_j - m τ + f_c + l_ij s_ij
        CPLEXfile.write("a" + chan.dstCell.timeIndex + "=");
        CPLEXfile.write(
            " a" + chan.srcCell.timeIndex +
            "– " + chan.initialTokens*τ );
        foreach (subchannel sc in chan) {
            CPLEXfile.write(
                " + f" + sc.freeSlackIndex
                " + " + sc.slackLatency + " s" + sc.slackIndex);
        }
        CPLEXfile.write("\n");
        // emit free-slack constraint f_c ≤ τ - τ_ij + s_ij(τ - τ_s)
        CPLEXfile.write(
            "f" + chan.freeSlackIndex + " ≤ " + chan.freeSlack)
        foreach (subchannel sc in chan) {
            CPLEXfile.write(
                " + " + sc.freeSlack + " s" + sc.slackIndex );
        }
        CPLEXfile.write("\n");
        // constrain slack to be non-negative
        foreach (subchannel sc in chan) {
            CPLEXfile.write(
                "0 ≤ s" + sc.slackIndex + "\n");
        }
        // constrain slack to be integral
        CPLEXfile.write("General\n");
        foreach (subchannel sc in chan) {
            CPLEXfile.write(
                "s" + sc.slackIndex + "\n");
        }
        CPLEXfile.write("End\n");
    }
}
WriteObjFunction(design,CPLEXfile) {
    allChannels = design.getAllChannelInstances( );
    CPLEXfile.write("minimize\n");
    foreach (channel chan in allChannels) {
        foreach (subchannel sc in chan) {
            CPLEXfile.write(" + " + sc.cost + " s" +
                sc.slackIndex +"\n");
        }
    }
}
```

Notice the object oriented nature of the design. Channel, and sub-channel data structures which implicitly contain their associated free-slack, latency, and local cycle-times, are assumed available through the "dot" notation. Finally notice that it is implicit in the file that all independent variables are non-negative. Once the MILP problem file is generated, the main program calls an external MILP solver and reads the results file to automatically add slack to the design.

The domain of the latency and cycle time values must be somewhat constrained in order for an integral solution to exist. In particular, if the pipeline buffers do not have sufficient free-slack or have arbitrary real-valued latency and cycle times, there may be no integral number of added pipeline buffers which satisfies all constraints. One way to increase the probability an integral solution exists is to replace fixed latency of the pipeline buffers with bounded latencies that can then be controlled by transistor sizing while maintaining a worst-case cycle time $\tau_s$. Conditions in which the integer condition can be dropped and linear programming approaches can be used to solve this problem will be discussed below.

Note that as a side-problem of the MILP minimization problem is the problem of performance verification of a channel-based asynchronous circuit in which we set all slack variables to 0 and determine if the set of equations are feasible. Our first result is that we can verify that a circuit satisfies the cycle time by checking if the above system of linear equations has a feasible solution. There exists a plethora of existing tools and techniques that solve this problem, including the well-known Simplex algorithm applicable to the LP system as described below, and we believe that these solutions may be at times faster than applications of Karp's theorem.

Similarly, another related problem is the problem of performance analysis of a channel-based asynchronous circuit in which we set all slack variables to 0, make the constant $\tau$ an independent variable, and minimize r subject to the modified set of constraints. Notice that the free-slack constraints $f_{ij} \leq \tau - \tau_{ij} + s_{ij}(\tau - \tau_s)$ reduces to $f_{ij} \leq \tau - \tau_{ij}$ and the approach reduces to a linear programming (LP) problem. This LP problem can be solved with many well-known algorithms and may yield faster run-times than the traditional approach using Karp's theorem.

The performance analysis of asynchronous designs has commonly used Petri Nets. The following provides a background on Petri-nets such that we can then formulate the pipeline optimization problem in terms of sub-classes of Petri-nets called Marked Graphs. After defining timed Marked Graphs, the theoretical relationship between the performance of the system and the non-negative solution is developed to a proposed linear system of equations. For a more general introduction to Petri Nets we refer the reader to J. L. Peterson, *Petri Net Theory and the Modeling of Systems*, Prentice-Hall, 1981, and T. Murata, *Petri nets: properties, analysis and application*, Proc. of the IEEE, vol. 77, no. 4, pp. 541-579, 1989, the entire disclosures of which are incorporated herein by reference for all purposes.

A Petri net is a four-tuple $N=(P, T, F, m_0)$ where P is a finite set of places, T is a finite set of transitions and $F \subseteq (P \times T) \cup (T \times P)$ is a flow relation, and $m_0 \in \aleph^{|P|}$ is the initial marking. A Petri net is usually represented as a bipartite graph in which P and T are the nodes. For any two nodes x and y, if $(x, y) \in F$ then there is an arc from x to y.

A marking is a token assignment for the place and it represents the state of the system. Formally, a marking is a |P|-vector m, where the number of tokens in place p under marking m, denoted by m(p), is a natural number. We say for an element $x \in P \cup T$, that •x is the preset of x defined as •x={y∈P∪T|(y, x)∈F} and x• is the postset of x defined as x•={y∈P∪T|(x, y)∈F}. A transition t is enabled at marking m if each place in •x is marked with at least one token. When a transition t is enabled, it can fire by removing one token from each place •x and adding one token to each place x•.

A marking m' is reachable from m if there is a sequence of firings $t_1 t_2 \ldots t_n$ that transforms m into m', denoted by m[$t_1 t_2 \ldots t_n$>m'. A sequence of transitions $t_1 t_2 \ldots t_n$ is a feasible sequence if it is firable from $m_0$. The set of reachable markings from $m_0$ is denoted by [$m_0$>. By considering the set of reachable markings as the set of states of the system, and the transitions among these markings as the transitions between the states, a reachability graph can be obtained representing the underlying behavior of the PN. A PN is m-bounded if no marking in [$m_0$> assigns more than m tokens to any place of the net. It is safe if it is 1-bounded.

A marked graph (MG) is a type of Petri net in which every place has at most one input and output transition, i.e., $|•p| \leq 1 \wedge |p•| \leq 1, \forall p \in P$. A timed MG is a MG in which delays are associated with transitions. We instead associate a delay with every place d(p) because the models are more intuitive for our purposes and less constrained. That is, every MG with delays associated with transitions can be translated into one in which this delay is instead associated with all places in its pre-set •t. Because each place has at most one transition in its post-set no ambiguity in place delays exist. A cycle c is a sequence of places p1 p2 . . . p1 connected by arcs and transitions whose first and last place is the same.

The cycle metric (CM(c)) is the sum of the delays of all associated places along the cycle c, d(c), divided by the number of tokens that reside in the cycle, m(c), i.e., CM(c)=d(c)/$m_0$(c). The cycle time of a MG is defined as the largest cycle metric among all cycles in the timed MG, i.e., max $\forall c \in C$ [CM(c)], where C is the set of all cycles in the timed MG. The intuition behind this well-known result is that the performance of any computation modeled with a timed MG is dictated by the cycle time of the timed MG and thus the largest cycle metric. There are many algorithms and approaches to solve this problem and we refer the reader to A. Dasdan. "Experimental Analysis of the Fastest Optimum Cycle Ratio and Mean Algorithms", ACM Transactions on Design Automation of Electronic Systems, Vol. 9, No. 4, October 2004, Pages 385-418 for a detailed review and comparison.

We first present properties of timed marked graph which are the theoretical basis of our slack matching algorithms. In particular, we define a set of equations which captures a feasible schedule of the timed marked graph by defining the arrival time of all transitions and the free-slack of every place.

Arrival time equation: For p∈P in which p connects $t_i$ to $t_j$ we define a forward time equation $$a_j = a_i + d(p) - \tau m_0(p) + f_p$$

Complete slack linear system: The above sets of equations can be captured in matrix form as follows. A x=b where
A is a matrix with |P| rows and |T|+|P| columns in which the entries of A satisfy
for all p∈P A(p, $t_i$)=−1 and A(p,$t_j$)=1 and A(p,p)=−1 and 0 otherwise.
b is a |P| by 1 vector in which
for all p∈P b(p)=d(p)−$\tau m_0(p)$
x is a |T|+|P| by 1 vector in which
for all t∈T x(t)=$a_t$,
for all p∈P x(p)=$f_p$ We first define cycles in their vector format and prove a related lemma. A simple cycle is a {0, 1} vector c of length |P| for which $cA_T=0$ where $A_T$ is the first |T| columns of A. A cycle is a non-negative vector d of length |P| for which $dA_T=0$. Notice that all simple cycles are also cycles and that a cycle can always be represented as a positively weighted sum of simple cycles. Let C represent the set of all simple cycles of A in matrix form, one cycle per row. Then notice that all cycles have cycle metrics less than τ is equivalent to saying in matrix form $Cb \leq 0$.

Lemma 1 If wC=y for some w and $y \leq 0$, then there exists $\hat{w} \leq 0$ s.t. $\hat{w}C=y$.

Proof: We use a negative form of the theorem of the separating hyperplane applied to the system of linear equations $C^T w = y$ which states that either there exists a non-positive solution to $C^T \hat{w} = y$ or there exists a z such that $zC^T \leq 0$ and $zy < 0$. Our approach is to assume $zC^T \leq 0$ and prove that $zy \geq 0$. We first decompose y=wC into the subtraction of two cycles $y = d_p - d_n$ where $d_p$ is the sum of the cycles corresponding to the positive elements of w and $d_n$ is the sum of the cycles corresponding to the negative elements of w and observe that since $y \leq 0$ we must have $d_n \geq d_p$. We then observe that $zy=z(d_p - d_n) = zd_p - zd_n$. Finally, because $d_n - d_p = d$ must be a cycle, that $zd_n = zd_p + zd$ and because $zC^T \leq 0$ we must have $zd \leq 0$. We conclude that $zd_n \leq zd_p$ and thus that $zy \geq 0$. QED.

The above lemma states that any non-positive vector y that is a (possibly mixed) weighted sum of cycles can also be expressed as a non-positive weighted sum of simple cycles. This lemma will be useful in proving our first theorem.

Theorem 1. $Cb \leq 0$ if and only if A x=b has a non-negative solution.

Proof: We will proof each half of the if and only if aspects of this theorem separately.

(if) Assume A x=b has a non-negative solution. Then consider a cycle c in vector form. cb equals the sum of $d(p) - \tau m_0(p)$ for all p∈P along the cycle c, i.e., $d(c) - \tau m_0(c)$. In addition, cAx equals the negative sum of the free slack x(p) along c. Because each free slack variable x(p) must be non-negative, this sum must be less than or equal to 0, i.e., $cAx \leq 0$. Since Ax=b, we know that cAx=cb and conclude $cb \leq 0$.

(only if) We use the theorem of the separating hyperplane which states that either there exists a non-negative solution to Ax=b or there exists a y such that $yA \geq 0$ and yb<0. In particular, we show that if $Cb \leq 0$ for any y for which $yA \geq 0$ yields $yb \geq 0$. To do this, partition A such that $yA = [yA_T \, yA_P]$ and observe that for $yA \geq 0$, we must have that $yA_T \geq 0$. For $yA_T \geq 0$, y must represent a possibly mixed linear combination of simple cycles y=wC because otherwise an odd edge would cause the entry in $yA_T$ corresponding to the source transition of the edge to be negative. Using Lemma 1 we conclude that y can also be expressed as a non-positive linear combination of cycles $y=\hat{w}C$, where $\hat{w} \leq 0$. This implies that yb equals the negative of the linear combination of cycle free-slack—$\Sigma_i \hat{w}_i f(c_i)$ because yb is the sum of $d(c_i) - \tau m_0(c_i)$ weighted by the non-positive value $\hat{w}_i$ for each cycle $c_i$. Since $Cb \leq 0$ implies that all cycle free slacks are non-negative, we conclude that $yb \geq 0$. QED.

The above theorem implies that the cycle metrics are all less than the desired target cycle time if and only if there exists a non-negative set of arrival times and free-slacks which satisfies the arrival time equation. The arrival times represent a periodic schedule for all transitions which meets the dependency constraints of the system and the target cycle time. The non-negative free-slack on a place indicate by how much the token in the place should be delayed before firing. Notice that this schedule may imply that some transitions may be delayed past the time when all tokens are available at its input places.

Note that a similar linear programming model was originally proposed by Magott to determine the minimum cycle time of a timed marked graph. In Magott's LP model, the free-slack variables were removed and the arrival time equation was reduced to the following inequality:

$$a_j \geq a_i + d(i) - \tau m_0(p)$$

This is a simpler and more efficient linear program when minimizing τ. For our purposes, however, it is critical to explicitly include the free-slack variables which can then be further constrained. We also note that in Magott gave no formal proof of the correctness of the LP problem and thus include Theorem 1 for completeness.

In the following discussion, we assume that each leaf-cell is a full buffer. We define a specific form of a Timed Marked Graph to model the system and identify the relationship between the cycle time of this system and a constrained system of linear equations in which the impact of additional pipeline buffers (slack) can be modeled. With this model we justify the MILP formulation of the slack matching problem. These results will be generalized to systems with a mixture of half and full buffers.

We model the hierarchical network of leaf cells with a novel Timed Marked Graph called a Full Buffer Channel Net (FBCN) defined as follows $N = (P \cup \overline{P}, T, F, m_0)$ which satisfies place symmetry, i.e., $|P| = |\overline{P}|$; channel connectivity, i.e., F satisfies the property that for every p∈P there exists $(t_i, p)$ and $(p, t_j) \in F$ and a p∈P such that $(t_i, \overline{p})$ and $(\overline{p}, t_j) \in F$; and finally single-token channels, i.e., for every p∈P, $m_0(p) + m_0(\overline{p}) = 1$. The intuition behind a channel net is that each leaf cell instance is modeled as a transition and each channel between ports of cell instances becomes two places. Four arcs in the flow relation connect the places to relevant leaf cell instance transitions.

The performance of the network is represented by modeling the performance of the channels as they are connected to the leaf-cells. In our model, the local cycle time is attributed to the output channels to which the leaf-cell is connected. d(p) represents the forward latency of a channel while the corresponding $d(\overline{p})$ represents the backward latency of channel. Intuitively, the forward latency represents the delay through an empty channel (and associated leaf-cell) and the backward latency represents the time it takes the handshaking circuitry within the neighboring leaf-cells to reset, enabling a second token to flow. The cycle metric associated with the cycle p and $\overline{p}$, $c(p \circ \overline{p})$, represents the local cycle time of the channel and as mentioned earlier, equals the sum of the two is the local cycle time of the channel, $c(p \circ \overline{p}) = d(p) + d(\overline{p}) / [m(p) + m(\overline{p})] = d(p) + d(\overline{p})$.

Figure 14:
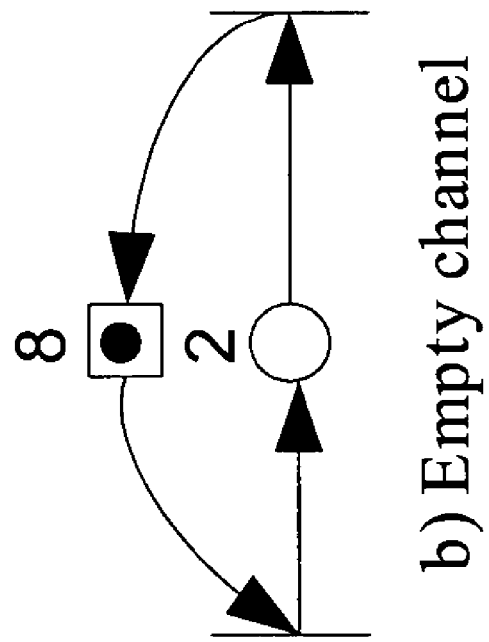
FIG. 14 provides illustrations of the modeling of a full buffer channel net (FBCN) for full and empty channels.
Figure 14:
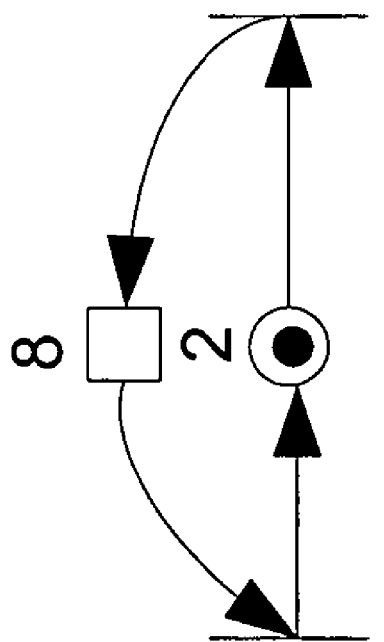

As an example, we illustrate two channels in FIG. 14. The circles represent forward places p∈P and the boxes represent backward places $\overline{p} \in \overline{P}$. In this example, both channels have forward latency of 2 and backward latency is 8 and thus have local cycle times of 2+8=10. In FIG. 14a, the forward channel is marked indicating that immediately after reset this channel is full. In FIG. 14b, the backward channel is marked indicating that immediately after reset this channel is empty. For illustrative purposes only the forward places are represented with circles while the backward places are represented with squares. Note that this model implies that every channel can hold one token and thus implicitly implies that the leaf-cells are full-buffers. In any marking, if the forward place is marked it represents the state in which a token is in the channel. Otherwise, the backward place is marked. This configuration guarantees that only one data/control token can reside in the channel and that the marked graph is safe. Extensions to the half-buffer models are described below.

We model the hierarchical nature of the design by associating a cell-type with each transition celltype(t). Channels of course may cross cell-hierarchy as illustrated in FIG. 12. We guarantee by construction that the structure of the PN is such that the sub-structure of each instance of a mid-level cell-type is the same.

The cycle time of the circuit is captured by the maximum cycle metric of the corresponding FBCN. The throughput of the circuit is the reciprocal of this value. Very often the additional buffers, also known as slack, must be added to the model to improve the cycle time to balance the pipelines. We model the addition of slack between by creating new transitions that represent buffer leaf-cells and corresponding channels in such a way to improve the performance of the design.

Figure 8:
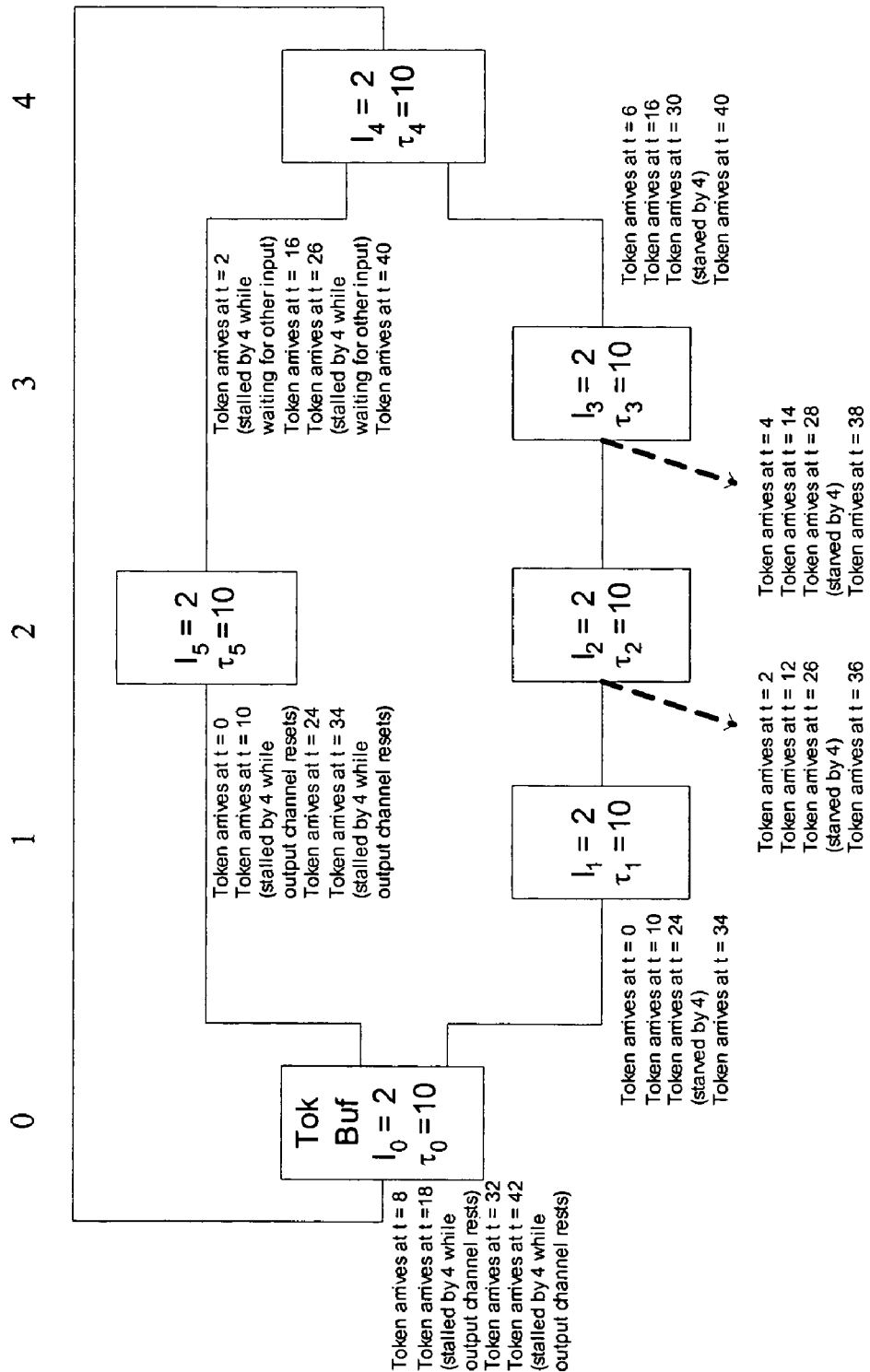
FIG. 8 is a flow diagram illustrating the operation of a homogeneous unbalanced pipeline.
Figure 15:
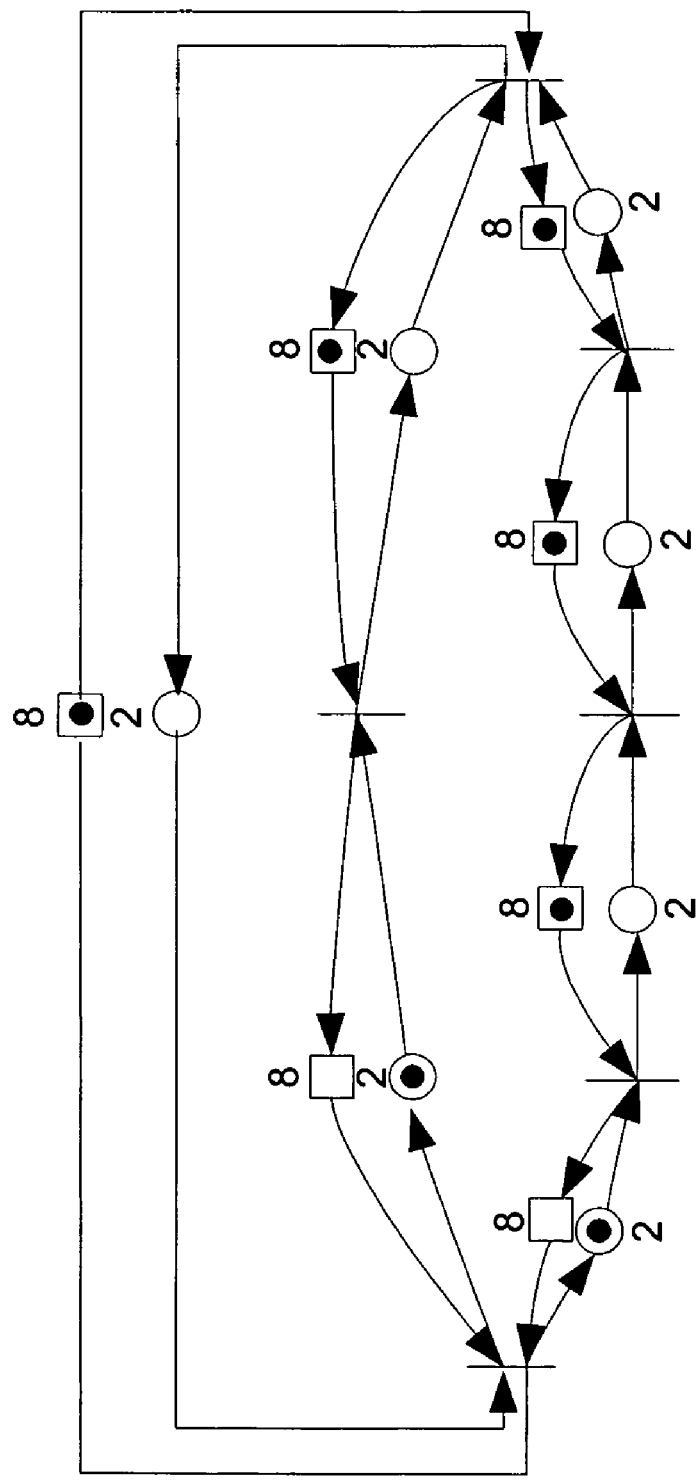
FIG. 15 provides an illustration of the modeling of an FBCN for a homogeneous un-balanced fork-join pipeline.

As an example, consider a homogeneous non-linear pipeline fork-join channel structure in which there are three buffers in one path and one buffer in the other path. The FBCN model of this structure is illustrated in FIG. 15. Notice also that the forking transition which represents the leaf-cell fork, has both of its output channels initially full, whereas all other channels are initially empty consistent with this leaf-cell being the only token buffer in the system, as illustrated in FIG. 8. The cycle yielding the maximum cycle metric includes the forward latency path through the long fork and the backward latency path of the short fork. It has a cycle metric of $(2+2+2+2+8+8)/2=24/2=12$.

Figure 16:
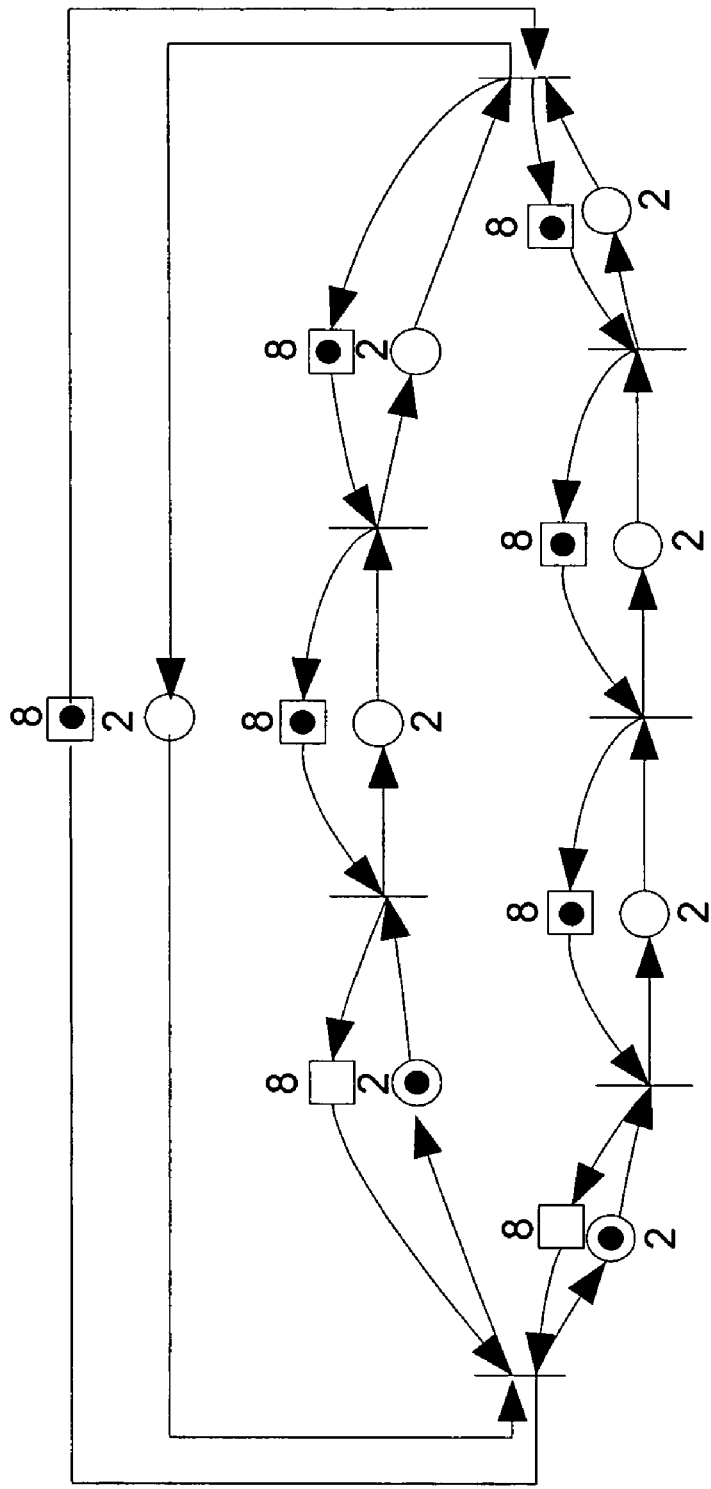
FIG. 16 illustrates how adding a pipeline buffer can improve the maximum cycle metric of an FBCN.

If a second buffer was inserted in the short forked path as illustrated in FIG. 16, the worst-case cycle metric reduces to $2+2+2+2+8+8+8/3=32/3=10\frac{2}{3}$. Moreover, if the inserted pipeline buffer had a backward latency of 6 instead of 8, the worst-case cycle metric would be 10, matching the worst local cycle time. Alternatively, a third buffer could be inserted in the short forked path with the same effect.

Theorem 1 can directly be applied to our FBCN because the FBCN is a Timed Marked Graph. It implies that the complete slack linear system of equations applied to the FBCN are necessary and sufficient conditions for the global cycle time to also be less than the target cycle time. While an important result, it by itself does not directly yield an algorithm for slack matching because it is not easy to model the addition of slack to resolve performance bottlenecks within this framework. Fortunately, this system of linear equations can be simplified in such a way that allows modeling the impact of additional slack within a linear programming framework. In particular, this complete slack linear system can be reduced by omitting all constraints specific to the backward places $\overline{P}$ in the FBCN. The idea as shown in Theorem 2 is to model the effects of these constraints by appropriately constraining the free-slack variables.

Reduced slack linear system: A linear system of equations $A_r x_r = b_r$ where
$A_r$ has $|P|$ rows and $|T|+|P|$ columns in which the entries of $A_r$ satisfy
for all $p \in P$ $A_r(p, t_i) = -1$ and $A_r(p, t_j) = 1$ and $A_r(p, p) = -1$ and 0 otherwise.
$b_r$ is a $|T|+|P|$ by 1 vector in which
for all $p \in P$ $b_r(p) = d(p) - \tau m_0(p)$
$x_r$ is a $|T|+|P|$ by 1 vector in which
for all $t \in T$ $x_r(t) = a_t$,
for all $p \in P$ $x_r(p) = f_p$
Theorem 2: $Cb \leq 0$ if and only if $A_r x_r = b_r$ has a non-negative solution in which $\forall p \in P$ $x_r(p) \leq \tau - c(p \circ \overline{p})$.

Proof: We will proof each half of the if and only if aspects of this proof separately.

(only if) By Theorem 1, there exists a non-negative solution x of A x=b. The subvector $x_r$ of x satisfies $A_r x_r = b_r$ because $A_r$ and $b_r$ are exactly the relevant submatrices of A and b. By the definition of Ax=b, $x(p)+x(\overline{p})=\tau-c(p \circ \overline{p})$, thus $x(p)=\tau-c(p \circ \overline{p})-x(\overline{p})$. Since $x(\overline{p})$ must be non-negative, $x_r(p)=x(p) \leq \tau-c(p \circ \overline{p})$.

(if) Assume $A_r x_r = b_r$ has a non-negative solution in which $\forall p \in P$ $x_r(p) \leq \tau - c(p \circ \overline{p})$. Then for all $\overline{p} \in \overline{P}$ let $x(\overline{p})=\tau-c(p \circ \overline{p})-x_r(p)$, creating the supervector $\hat{x}$. By the definition of the equations that make up the complete system of linear equations A x=b, it is clear that $\hat{x}$ is a solution for x. Because $x_r(p) \leq \tau-c(p \circ \overline{p})$ we know that $x(\overline{p})=\tau-c(p \circ \overline{p})-x_r(p) \leq 0$. Because $x_r$ is non-negative, we thus know $\hat{x}$ is non-negative. Using Theorem 1, we conclude $Cb \leq 0$. QED.

Figure 10:
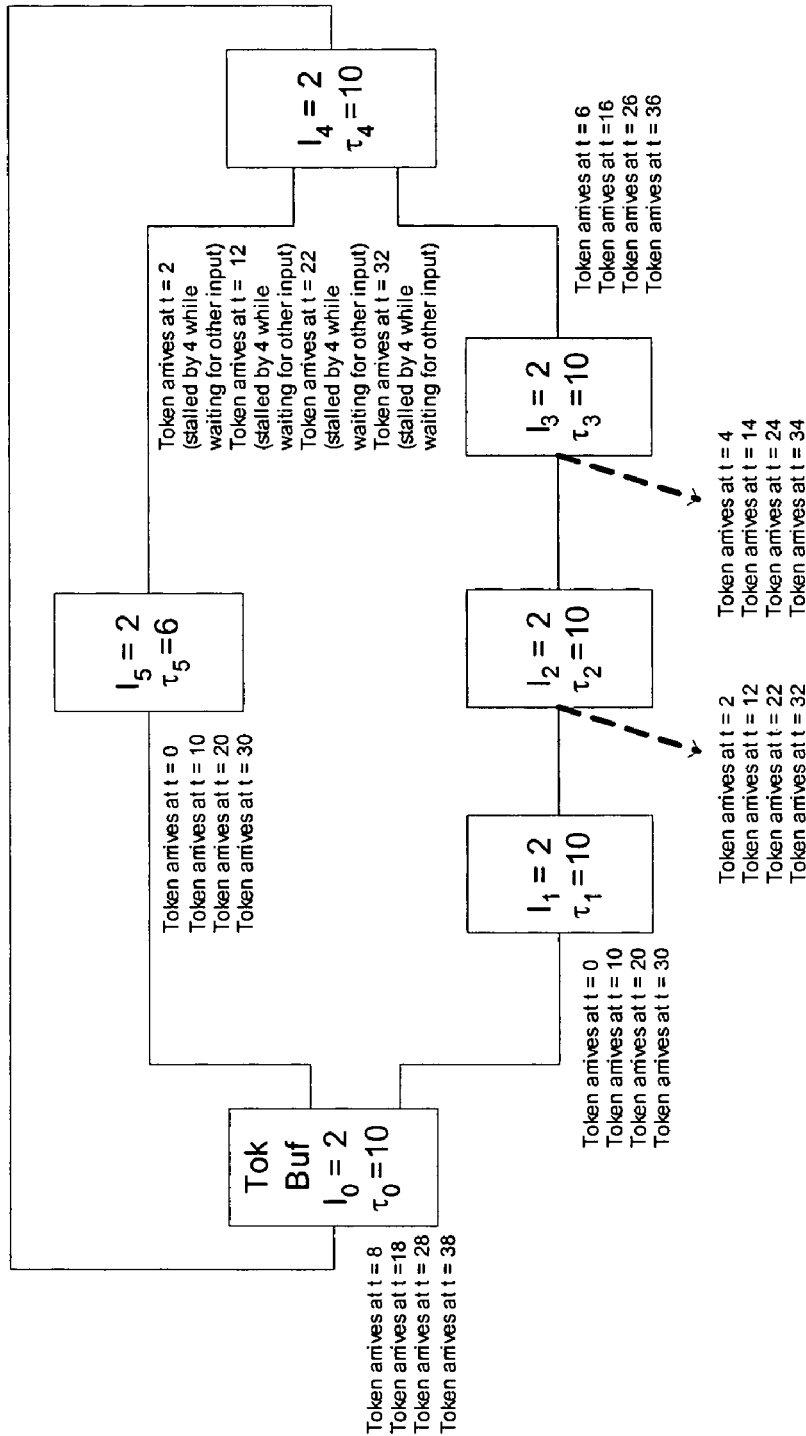
FIG. 10 is a flow diagram illustrating the benefits of free-slack in an unbalanced fork-join pipeline.

As an example of this theorem, the reduced slack linear system for our non-n homogeneous un-balanced fork-join pipeline in FIG. 10 in matrix form (in which we omit free slack variables that must be 0) is as follows:

$$\begin{bmatrix} -1 & 1 & 0 & 0 & 0 & 0 & 0 \\ -1 & 0 & 0 & 0 & 0 & 1 & 0 \\ 0 & -1 & 1 & 0 & 0 & 0 & 0 \\ 0 & 0 & -1 & 1 & 0 & 0 & 0 \\ 0 & 0 & 0 & -1 & 1 & 0 & 0 \\ 0 & 0 & 0 & 0 & 1 & -1 & -1 \\ 1 & 0 & 0 & 0 & -1 & 0 & 0 \end{bmatrix} \begin{bmatrix} a_0 \\ a_1 \\ a_2 \\ a_3 \\ a_4 \\ a_5 \\ f_5 \end{bmatrix} = \begin{bmatrix} -8 \\ -8 \\ 2 \\ 2 \\ 2 \\ 2 \\ 2 \end{bmatrix}$$

Please note that the fact that this matrix is square is a coincidence. If, for example, the fifth channel had no free slack it would be an over-constrained system with more rows than columns. As is, this system of linear equations does have a non-negative solution $x_r=[8\ 0\ 2\ 4\ 6\ 0\ 4]$ which also satisfies the constraints $f_5 \leq 4$ and thus the system has a cycle time of no more than 10. This is consistent with our intuitive-based analysis of this example.

The importance of Theorem 2 is that the backward places and corresponding free-slack can be removed from the formulation which makes representing the impact of additional free-slack straight-forward. In particular, note that the set of constraints proposed above is the same but applied to a parameterized system $A_p x_p = b_p$ in which slack can be added to each channel. Each possible slack configuration has an associated FBCN model and thus must adhere to the constraints of Theorem 2 in order to meet the global cycle time. Consequently, Theorem 2 shows that, under the full-buffer model of computation, the proposed MILP constraints are necessary and sufficient for the parameterized system to satisfy the global cycle time. More simply this means that the proposed MILP framework yields the optimum slack matching result when all leaf cells are full buffers.

The FBCN model assumes that each leaf cell is a full buffer. However, some of the most common leaf cell templates are in fact so called half buffers. Unlike full buffers, half buffers cannot have a token at the output and input channels simultaneously. Thus, a linear pipeline of N half buffers can hold a maximum of N/2 tokens. In this section we describe a mixed channel net (MCN) model of the circuit and describe changes to the theory and MILP that properly take into consideration circuits made up of both half buffers and full buffers. In particular we show that each half-buffer in the model yields an additional constraint on the sum of the free slacks of the associated input and output channels.

Figure 17:
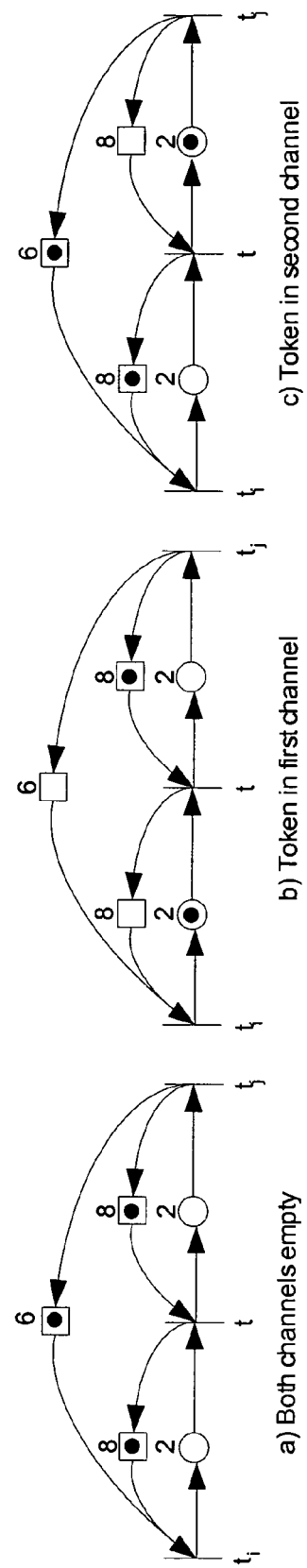
FIG. 17 illustrates Petri-net models for pipelines with half-buffers.

Petri net models for pipelines with half buffers are shown in FIG. 17 and fall into one of three configurations depending on which, if any, channel contains a token upon reset. The middle transition models a half buffer, and the associated backward place constrains its input and output channels to have at most one token. The delay on this half-buffer backward place represents the handshaking delay between a token arriving at the right buffer and a new token entering the left channel. Note that the transitions to the left and right of the middle tokens may either be half or full buffers. If either right or left cell is a half buffer, however, we would add additional backward place(s) to the Petri net model.

More formally, a Mixed Channel Net (MCN) is defined as a timed Petri Net $N=(P \cup \overline{P} \cup \overline{P}_h, T, F, m_0)$ which like FBCN satisfies place symmetry, i.e., $|P|=|\overline{P}|$; channel connectivity, i.e., F satisfies the property that for every $p \in P$ there exists $(t_i, p)$ and $(p, t_j) \in F$ and a $\overline{p} \in \overline{P}$ such that $(t_j, \overline{p})$ and $(\overline{p}, t_i) \in F$, single-token channels, i.e., for every $p \in P$, $m_0(p)+m_0(\overline{p})=1$. In addition, however, MCN must contain half buffer places in which for each half buffer leaf cell t there exists a place $\overline{p} \in \overline{P}_h$ and $(t_j, \overline{p})$ and $(\overline{p}, t_i) \in F$ for every pair of transitions $t_i$ and $t_j$ for which there is a channel from $t_i$ to t and a channel from t to $t_j$. Lastly, for every half buffer backward place $\overline{p}$ with $(t_j, \overline{p})$ and $(\overline{p}, t_i) \in F$ the initial marking must satisfy the half buffer constraint $m_0(p_i)+m_0(p_j)+m_0(\overline{p})=1$ guaranteeing that the initial marking does not have a token in both the input and output channels of the half-buffer.

We first define an enhanced full system of linear equations which define the performance of the mixed-buffer design. For each half-buffer place $\overline{p} \in \overline{P}_h$ in which $\overline{p}$ is associated with transition $t_k$ and connects $t_j$ to $t_i$ we introduce a new independent non-negative free-slack variable $f_{\overline{p}}$ and introduce a half-buffer time equation:

$$a_i = a_j + d(\overline{p}) - \tau m_0(\overline{p}) + f_{\overline{p}}.$$

The enhanced matrix representation be $A_m x_m = b_m$ and let $C_m$ represent all simple cycles in the mixed graph. With straight forward modifications to the proof of Theorem 1, we conclude a similar statement for this enhanced system of linear equations:

Theorem 3: $C_m b \leqq 0$ if and only if $A_m x_m = b_m$ has a non-negative solution.

Moreover, the half-buffer equation can be simplified by summing the other forward constraints on $a_j$ and $a_i$.

$$a_k = a_i + d(p_{ik}) - \tau m_0(p_{ik}) + f_{p_{ik}}$$

$$a_j = a_k + d(p_{kj}) - \tau m_0(p_{kj}) + f_{p_{kj}}$$

to get $$a_j = a_i + d(p_{ik}) - \tau m_0(p_{ik}) + f_{p_{ik}} + d(p_{kj}) - \tau m_0(p_{kj}) + f_{p_{kj}}$$

and realizing that this reduces to the following constraint on the sum of the free slacks on the two channels:

$$f_{p_{ik}} + f_{p_{kj}} = -d(\overline{p}) + \tau m_0(\overline{p}) - f_{\overline{p}} - [d(p_{ik})+d(p_{kj})-\tau m_0(p_{ik})-\tau m_0(p_{kj})] = \tau - [d(p_{ik})+d(p_{kj})+d(\overline{p})] - f_{\overline{p}}$$

where the last simplification follows from the half-buffer constraint on the initial marking. This means that requiring that the local cycle involving three neighboring buffers meet the target cycle time (i.e., that a positive $f_{\overline{p}}$ exists) can be achieved by simply constraining the sum of the two component free-slacks as follows $$f_{p_{ik}} + f_{p_{kj}} \geqq \tau - [d(p_{ik})+d(p_{kj})+d(\overline{p})]$$

Figure 18:
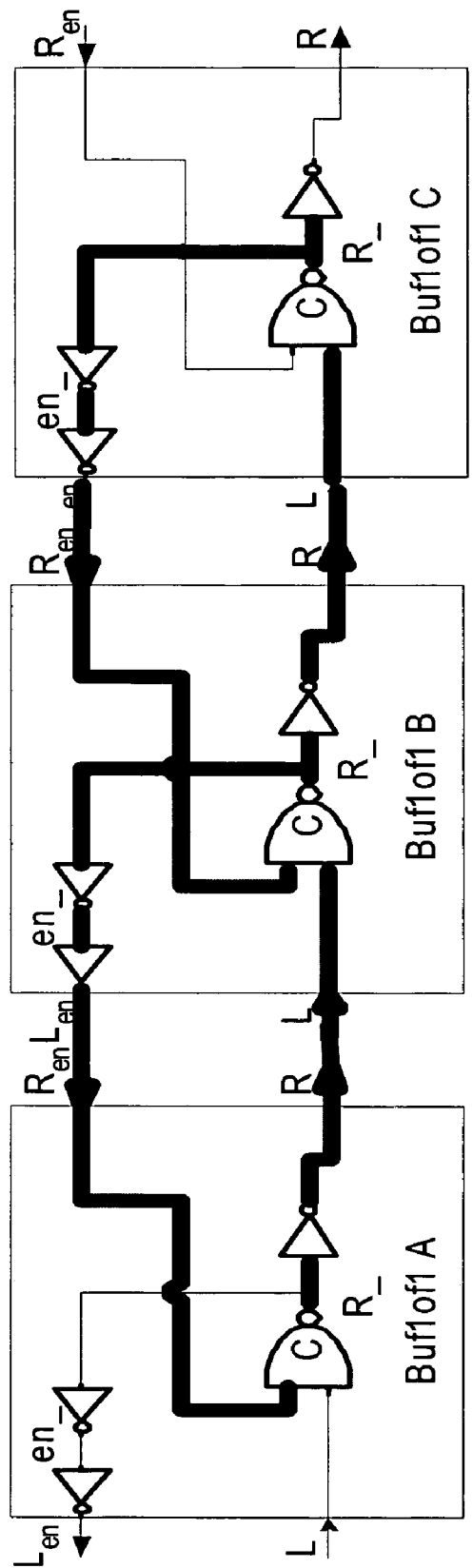
FIG. 18 shows three half-buffers with a local cycle that cross the three cells highlighted.

As an example, consider the three weak-conditioned half-buffer buf1of1 cells shown in FIG. 18. There are many cycles which limit the local cycle and the local cycle that includes all three buffers is highlighted. This cycle represents the following behavior: The three buffers evaluate in sequence, followed by the second pre-charging, enabling the first to re-evaluate. It has a cycle time of 10. Other local cycles that span only two buffers also have a cycle time of 10. Let target cycle time $\tau=12$. If each half-buffer was incorrectly modeled as a full-buffer model, each of the two channels that connect these buffers would have a free-slack of 2 and the total between the two channels is a free-slack of 4. This implies that the third buffer could be stalled by 4 (for example because $C.R_{en}$ is delayed by 4 which causes C.en to be delayed by 4) without impacting the global cycle time. However, in reality, this is not true because a stall of 4 would increase the time of the highlighted cycle to 14, violating the target cycle time of 12. The above free-slack constraint addresses this issue by constraining the sum of the slacks of the two channels to be less than 2.

To formalize this analysis, we extend Theorem 2 to the MCN model. We define $C_{ml}$ to be all local cycles in the mixed matrix model, including the local cycles representing the handshaking loop between three consecutive half-buffers. We then extend our assumption that all local cycles satisfy the global cycle time to all cycles in $C_{ml}$. With this assumption, the enhanced system of linear equations that includes this half-buffer timing equation represent necessary and sufficient conditions for satisfying the global cycle time as follows (the proof follows the same approach as in the proof of Theorem 2):

Theorem 4: $C_m b \leqq 0$ if and only if $A_{mr} x_{mr} = b_{mr}$ has a non-negative solution in which $$\forall p \in P \; x_{mr}(p) \leqq \tau - c(p \circ \overline{p}) \text{ and}$$

$$\forall \overline{p} \in \overline{P}_h x_{mr}(p_{ik}) + x_{mr}(p_{kj}) \leqq \tau - [d(p_{ik})+d(p_{kj})+d(\overline{p})]$$

Theorem 4 provides the basis of a modified MILP program to support mixed-buffer systems. One issue associated with this solution is how to properly model the impact of additional pipeline buffers on the set of slack constraints and in particular the $d(\overline{p})$'s related to any half buffer prior to and after the added buffers. The following presents both exact and heuristic solutions to this problem.

Figure 19:
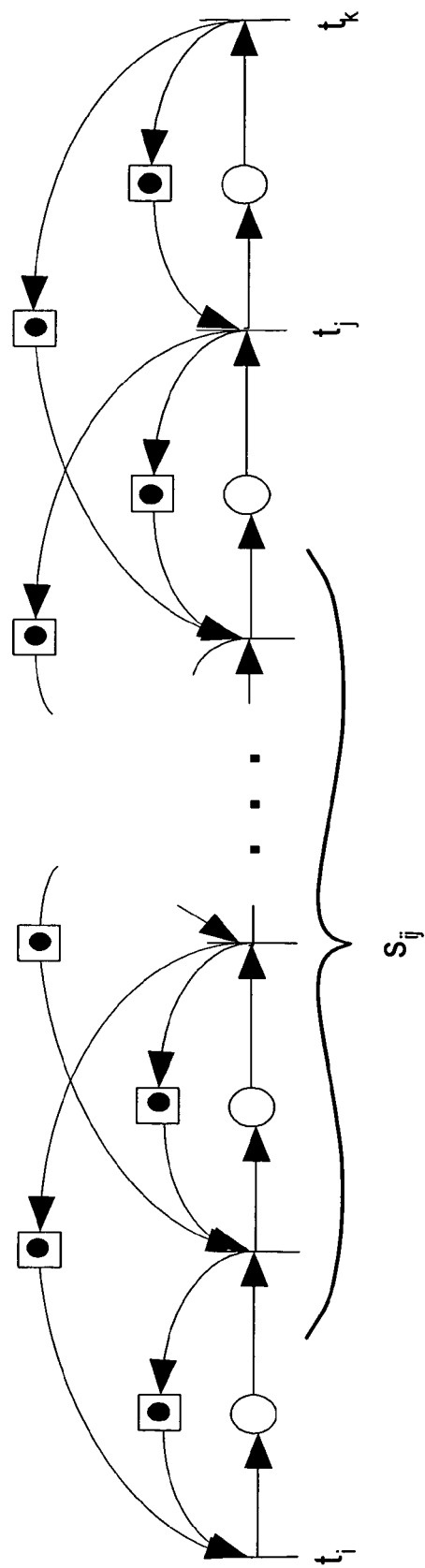
FIG. 19 is a mixed channel net (MCN) model of parametrized half-buffer slack.

Consider the case where there are $s_{ij}$ identical half-buffer slack cells on the channel connecting two stages i and j, followed by some stage k. The MCN model is shown in FIG. 19. To examine this model, we introduce the following definitions. Note: In this formulation an s subscript will be used in delay parameters to refer to a slack buffer stage.

| | |
|---|---|
| $l_{xy} = d(p_{xy})$ | Forward latency of some stage x along the channel connected to stage y. |
| $\bar{l}^{(1)}_{xyz} = d(\overline{p}_{xy})$ | First-order (single-cell) backwards handshake delay from some stage y to the preceding stage x. In the fully general case, this delay depends on the properties of the stage k that follows y, so we will express it as a function of the sequence of cells x, y, z. For example, $\bar{l}^{(1)}_{sjk}$ is the first-order backwards handshake delay between a slack buffer and stage j, followed by k. |
| $\bar{l}^{(2)}_{xyz} = d(\overline{p}_{xyz})$ | Second-order (double-cell) backwards handshake delay through some stage z, then y, then x. This parameter also depends on the timing properties of the three sequential stages, but no others. For example, $\bar{l}^{(2)}_{isj}$ is the delay of the second-order arc connecting stage j to stage i in the $s_{ij}$ = case. |
| $\mu(x, y, z) = \tau - l_{xy} - \bar{l}^{(1)}_{xyz}$ | Maximum free timing slack on the channel between stages x and y (followed by z) due to the first-order handshake constraint. |

-continued

| | |
|---|---|
| $\lambda(x, y, z) = \tau - 1_{xy} - 1_{yz} - \overline{1}_{xyz}^{(2)}$ | Maximum sum of the free timing slack between stages x and z due to the second-order handshake constraint. |
| $S_{max}$ | Maximum number of slack buffers allowed on any channel in the system. That is, $s_{ij} \leq S_{max}$. |
| $f_{ij}(n)$ | Free timing slack on the nth slack stage between cells i and j, for $n = 0 \ldots s_{ij}$. |
| $F_{ij} = \sum_{n=0}^{s_{ij}} f_{ij}(n)$ | Total free timing slack on the channel between stage i and j. |
| $a_i, a_j$ | Arrival times of stages i and j. |
| $m_{ij} = \tau \cdot m_0(p_{ij})$ | Initial token count on the channel connecting stages i and j (expressed in units of the timing slack provided by the initial token, for notational clarity.) Either 0 or $\tau$. |

This MILP formulation gives the exact linear constraints relating variables $a_i$, $a_j$, $f_{ij}(n)$, $f_{jk}(0)$, $s_{ij}$, and $s_{jk}$ to constant circuit properties such as $1_{ij}$, $1_{ijk}^{(1)}$, $1_{isj}^{(1)}$, $1_{ijk}^{(2)}$, $m_{ij}$, etc. $S_{max}$ is a global system constant which must be chosen to be sufficiently large.

This formulation does not make any attempt to reduce the $S_{max}$ $f_{ij}(n)$ variables to a more manageable number. A variety of exact analytical simplifications and conservative approximations can be made to reduce the complexity of this formulation; one such approximation is described later.

The forward latency equality, relating $a_j$ and $a_i$, requires the least modification from the full buffer model. It can be written directly as the sum of arrival time differences across the linear chain of buffers:

$$a_j = a_i + m_{ij} + F_{ij} + \begin{cases} 1_{ij}, & s_{ij} = 0 \\ 1_{is} + 1_{ss}(s_{ij} - 1) + 1_{sj}, & s_{ij} > 0 \end{cases} \quad (F\_C)$$

Note that since all slack buffer stages reset empty, there are no $m_s$ terms to include.

All first-order, single-stage cycles between neighboring stages x and y impose the following general constraint:

$$f_{xy} + l_{xy} + \overline{l}_{xyz}^{(1)} \leq \tau.$$

Expressed in terms of the nomenclature defined above, this can be written more concisely as $$f_{xy} \leq \mu(x,y,z).$$

Figure 20:
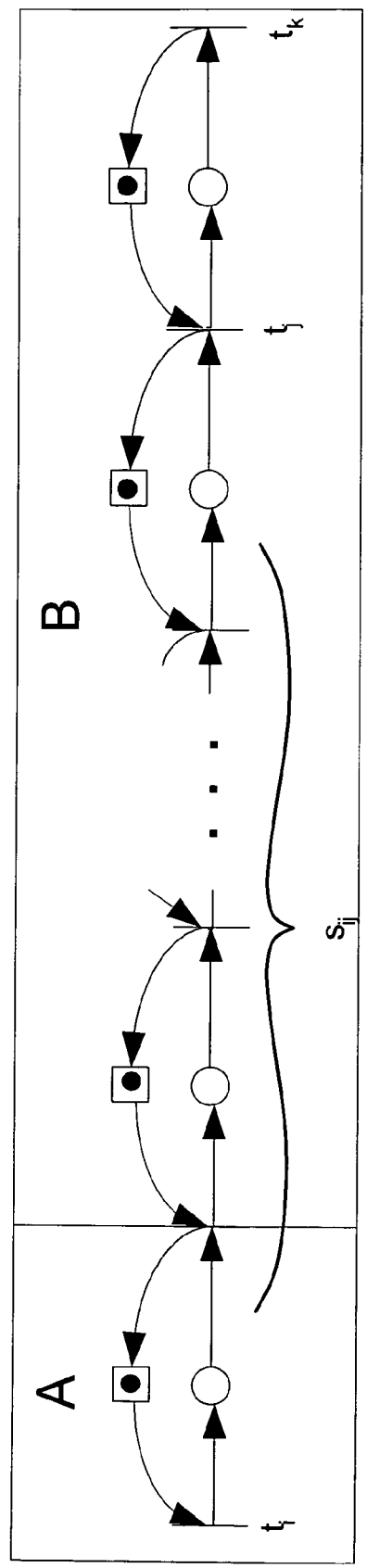
FIG. 20 illustrates the partitioning of a parametrized MCN models into two parts.

Applying this to the first single-stage cycle in the array of slack buffers between i and j (labelled A in FIG. 20), we obtain the following conditional constraint:

$$f_{ij}(0) \leq \begin{cases} \mu(i, j, k), & s_{ij} = 0 \wedge s_{jk} = 0 \\ \mu(i, j, s), & s_{ij} = 0 \wedge s_{jk} > 0 \\ \mu(i, s, j), & s_{ij} = 1 \\ \mu(i, s, s), & s_{ij} > 1 \end{cases} \quad (B1A\_C)$$

The subsequent first-order cycles (those labeled B in FIG. 20) are represented by the following constraints for $n=1 \ldots S_{max}$:

$$f_{ij}(n) \leq \begin{cases} \mu(s, s, s), & n < s_{ij} - 1 \\ \mu(s, s, j), & n = s_{ij} - 1 \\ \tau, & n = s_{ij} \\ 0, & n > s_{ij} \end{cases} \quad (B1B\_C)$$

$$f_{ij}(s_{ij}) \leq \begin{cases} \tau, & s_{ij} = 0 \\ \mu(s, j, k), & s_{ij} > 0 \wedge s_{jk} = 0 \\ \mu(s, j, s), & s_{ij} > 0 \wedge s_{jk} > 0 \end{cases} \quad (B1C\_C)$$

Note that for $n > s_{ij}$, the corresponding slack buffers do not exist, so their free slack variables $f_{ij}(n)$ are unused. The above constraint forces them to be zero so that the sum $F_{ij}$ may be calculated over the unconditional set $n=0 \ldots S_{max}$.

The second-order, double-stage cycles spanning neighboring stages x, y, and z impose the following general constraint:

$$f_{xy} + f_{yz} + l_{xy} + l_{yz} + \overline{l}_{xyz}^{(2)} \leq \tau,$$

which once again can be represented in a more abbreviated manner:

$$f_{xy} + f_{yz} \leq \lambda(x,y,z).$$

Figure 21:
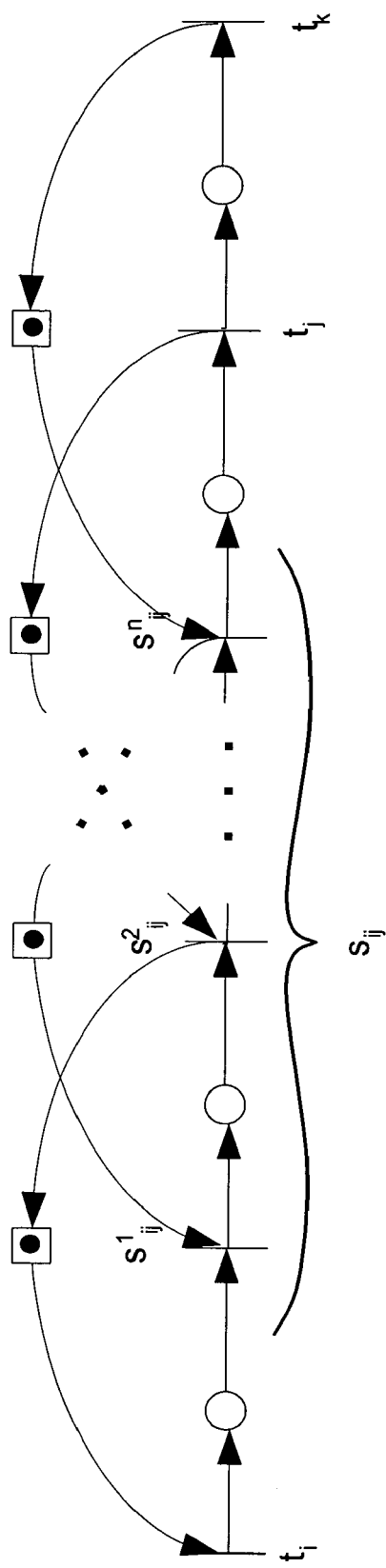
FIG. 21 illustrates 2nd order backward arcs in an MCN model of parametrized slack.

Applying this to the first internal double-stage cycle beginning at stage i, illustrated in FIG. 21, we obtain $$f_{ij}(0) + f_{ij}(1) \leq \begin{cases} \tau, & s_{ij} = 0 \\ \lambda(i, s, j), & s_{ij} = 1 \\ \lambda(i, s, s), & s_{ij} > 1 \end{cases} \quad (B2A\_C)$$

Note that in the $s_{ij}=0$ case, the associated double-stage cycle does not exist, so this constraint must have no effect. Constraint B1B_C will ensure that $f_{ij}(1)=0$ when $s_{ij}=0$, so in this case B2A_C indeed reduces to the vacuous constraint $f_{ij}(0) \leq \tau$.

Next, the second-order constraints imposed by the internal slack-to-slack second-order cycles can be written as follows (for $n=1 \ldots S_{max}$):

$$f_{ij}(n) + f_{ij}(n+1) \leq \begin{cases} \lambda(s, s, s), & n < s_{ij} - 1 \\ \lambda(s, s, j), & n = s_{ij} - 1 \\ \tau, & n \geq s_{ij} \end{cases} \quad (B2B\_C)$$

Note that once again the constraint becomes vacuous for all non-existent cycles.

Finally, the last second-order cycle in the slack array between stages i and j must be constrained together with the first $f_{jk}(0)$ term of the subsequent channel.

$$f_{ij}(s_{ij}) + f_{jk}(0) \leq \begin{cases} \lambda(i, j, k), & s_{ij} = 0 \wedge s_{jk} = 0 \\ \lambda(i, j, s), & s_{ij} = 0 \wedge s_{jk} > 0 \\ \lambda(s, j, k), & s_{ij} > 0 \wedge s_{jk} = 0 \\ \lambda(s, j, s), & s_{ij} > 0 \wedge s_{jk} > 0 \end{cases} \quad (B2C\_C)$$

The above system of constraints exactly represents all timing relationships in the parameterized MCN circuit model presented above. However, the nonlinear conditional terms present in F_C, B1A_C, B1B_C, B1C_C, B2A_C, B2B_C, and B2C_C make the system unsuitable for MILP optimization. These nonlinear conditions must be re-expressed in a linear manner by introducing additional integer utility variables.

In particular, for each channel $s_{ij}$ we will define binary slack enumeration variables, $e_{ij}(n) \in \{0,1\}$, constrained as follows:

$$\sum_{n=0}^{s_{max}} e_{ij}(n) = 1$$

$$\sum_{n=0}^{s_{max}} n \cdot e_{ij}(n) = s_{ij}.$$

The first constraint imposes that only a single $e_{ij}(n)$ can be 1, with $e_{ij}(m)=0$ for $m \neq n$, and the second constraint ensures that $n = s_{ij}$. With these enumeration variables, all constant conditional terms guarded by expressions such as $s_{ij} = c$ can be represented as a multiplication of that constant by $e_{ij}(c)$. Similarly, conditions such as $s_{ij} > 0$ can be expressed as a multiplication by $(1-e_{ij}(0))$. Since such greater-than conditions are common, we will define the following terms for notational clarity:

$$g_{ij}(n) = \sum_{m=n+1}^{s_{max}} e_{ij}(m)$$

Next, inequalities B1A_C, B1C_C, and B2C_C involve cross-dependencies between $s_{ij}$ and $s_{jk}$ which suggest a nonlinear product of $e_{ij}$ and $e_{jk}$ variables. Specifically, these inequalities reference four mutually exclusive cases:

Case 0: $s_{ij}=0 \wedge s_{jk}=0$
Case 1: $s_{ij}=0 \wedge s_{jk}>0$
Case 2: $s_{ij}>0 \wedge s_{jk}=0$
Case 3: $s_{ij}>0 \wedge s_{jk}>0$ Fortunately these cases can be represented in a linear manner by defining the binary variables $c_{ij}(p) \in \{0,1\}$ for $p=0 \ldots 3$ with the following constraints:

$$\sum_{n=0}^{3} c_{ijk}(n) = 1$$

$$c_{ijk}(0) \leq \frac{1}{2}(e_{ij}(0) + e_{jk}(0))$$

$$c_{ijk}(1) \leq \frac{1}{2}(e_{ij}(0) + g_{jk}(0))$$

$$c_{ijk}(2) \leq \frac{1}{2}(g_{ij}(0) + e_{jk}(0))$$

$$c_{ijk}(3) \leq \frac{1}{2}(g_{ij}(0) + g_{jk}(0))$$

Another product of system variables arises in constraint F_C, in the $l_{ss}(s_{ij}-1)$ expression guarded by the condition $s_{ij}>0$. A straightforward multiplication of $(s_{ij}-1)l_s \times g_{ij}(0)$ gives the product of variables $s_{ij} \cdot e_{ij}(0)$. We can work around this problem by applying the following general relation:

$$(s_{ij} - n) \cdot g_{ij}(n-1) = s_{ij} - n + \sum_{m=1}^{n} m \cdot e_{ij}(n-m)$$

With these utility terms, we are now prepared to eliminate all nonlinear conditional expressions in constraints F_C, B1A_C, B1B_C, B2A_C, and B2B_C. However, constraints B1C_C and B2C_C involve a remaining unresolved nonlinearity: the variable indexing of $f_{ij}(s_{ij})$. To linearize this term, we must introduce an additional free slack variable $f_{ij}'$ which will be constrained such that it always equals the $s_{ij}$th free slack variable. Then we will use this $f_{ij}'$ variable in place of $f_{ij}(s_{ij})$. Specifically, $f_{ij}'$ is constrained as follows, for $n=0 \ldots S_{max}$:

$$f_{ij}(n) - f_{ij}' \leq \begin{cases} 0, & s_{ij} = n \\ \tau, & s_{ij} \neq n \end{cases}$$

$$f_{ij}' - f_{ij}(n) \leq \begin{cases} 0, & s_{ij} = n \\ \tau, & s_{ij} \neq n \end{cases}$$

Together these two constraints ensure that $f_{ij}'=f_{ij}(n)$ for $n=s_{ij}$ and have no effect when $n \neq s_{ij}$ (since all $f_{ij}(n) \leq \tau$.)

With these results we can now formulate a linear system of constraints involving integer and real variables that exactly represents the timing behavior of the parameterized MCN circuit model:

$$a_j = a_i + m_{ij} + \sum_{n=0}^{S_{max}} f_{ij}(n) + \quad (F)$$
$$l_{ij} e_{ij}(0) + (l_{sj} + l_{js}) g_{ij}(0) + l_{ss}(s_{ij} - 1 + e_{ij}(0))$$

$$f_{ij}(0) \leq \mu(i, j, k) \cdot c_{ijk}(0) + \quad (B1A)$$
$$\mu(i, j, s) \cdot c_{ijk}(1) + \mu(i, s, j) \cdot e_{ij}(1) + \mu(i, s, s) \cdot g_{ij}(1)$$

$$f_{ij}(n) \leq \mu(s, s, s) \cdot g_{ij}(n+1) + \mu(s, s, j) \cdot e_{ij}(n+1) + \tau \cdot e_{ij}(n) \quad (B1B)$$
$$(n = 1 \ldots S_{max})$$

$$f_{ij}' \leq \tau \cdot e_{ij}(0) + \mu(s, j, k) \cdot c_{ijk}(2) + \mu(s, j, s) \cdot c_{ijk}(3) \quad (B1C)$$

$$f_{ij}(0) + f_{ij}(1) \leq \tau \cdot e_{ij}(0) + \lambda(i, s, j) \cdot e_{ij}(1) + \lambda(i, s, s) \cdot g_{ij}(1) \quad (B2A)$$

$$f_{ij}(n) + f_{ij}(n+1) \leq \quad (B2B)$$
$$\lambda(s, s, s) \cdot g_{ij}(n+1) + \lambda(s, s, j) \cdot e_{ij}(n+1) + \tau \cdot \sum_{m=0}^{n} e_{ij}(m)$$
$$(n = 1 \ldots S_{max} - 1)$$

$$f_{ij}' = f_{jk}(0) \leq \lambda(i, j, k) \cdot c_{ijk}(0) + \quad (B2C)$$
$$\lambda(i, j, s) \cdot c_{ijk}(1) + \lambda(s, j, k) \cdot c_{ijk}(2) + \lambda(s, j, s) \cdot c_{ijk}(3)$$

$$f_{ij}' - f_{ij}(n) \leq \tau \cdot (1 - e_{ij}(n))$$
$$f_{ij}(n) - f_{ij}' \leq \tau \cdot (1 - e_{ij}(n))$$
$$(n = 0 \ldots S_{max})$$

All other utility variables are constrained as specified above.

We can also obtain a simpler MILP by replacing the individual $f_{jk}'(n)$ variables with a single variable slack $f_{ij}'$. Both exact and approximate simplifications are possible. Exact simplifications are mathematically equivalent but use fewer variables. In particular, by avoiding $f_{jk}'(n)$ variables the number of variables does not depend on the maximum slack allowed in a channel. Approximations of these equations are also possible to further simplify the system of equations and are based on a few other reasonable approximations.

First, by assuming that the sum of the latency between cell i and cell j through $s_{ij}$ buffers is $l_{ij}+l_s s_{ij}$, the sum of arrival time constraint equation (F) can be reduced to $$a_i = a_j - m\tau + f_{ij} + l_{ij} + f_{ij}' + l_s s_{ij},$$

where the latency of a channel emanating form a slack cell is assumed to be constant and referred to it as $l_s$.

Second, the native free-slack equations (B1A) can also be conservatively bound as follows $$f_{ij} \leq \tau - (l_{ij} + \bar{l}_{ji})$$

assuming that reasonable assumption that replacement of slack buffers on either side of the cell i would only increase the upper bound. Note to improve conciseness, we define $\tau_{ij} = l_{ij} + \bar{l}_{ji}$.

Third, we can bound the free-slack $f_{ij}'$ associated with $s_{ij}$ buffers as $$f_{ij}' \leq s_{ij}(\tau - (l_{ss} + \bar{l}_{ss}))$$

if the added slack buffers are actually full buffers. This is a practical assumption because slack cells can often be made as compact full buffers with very low cycle times (e.g., 6). If, however, they are made from half-buffers, then modifications to reflect the potentially lower slack should be applied. The only requirement is that the free-slack is a linear function of sit.

This linear function can be obtained through algorithmic analysis or simulation of actual pipeline buffer cells. One tricky aspect of this analysis is that the free-slack of half-buffer slack cells actually depends on the characteristics of the neighboring non-slack buffers and thus either a worst-case analysis must be used or the equations need to be modified to include characteristics of the neighboring non-slack buffers. The worst-case analysis must under-estimate the slack of buffers and likely could be designed to have a significant impact only when $s_{ij}$ is small. That is, the relative amount of under estimation would be smaller as $s_{ij}$ grows. Note to improve conciseness, we define $\tau_s = l_{ss} + \bar{l}_{ss}$.

Fourth, we can remove the need of the utility terms $e_{ij}$ by re-writing the constraint for $g_{ij}(0)$ as follows:

$$M g_{ij}(0) \geq s_{ij}$$

where M is a large constant chosen such that the constraint M $g_{ij}(0) \geq s_{ij}$ guarantees $g_{ij}(0)$ is 1 if any slack is used between leaf cell instances i and j.

Fifth, the half-buffer slack constraint can be further simplified by using the more conservative constraint $$f_{ij} + f_{jk} \leq \tau - [\max(l_{ij} + l_{jk} + \bar{l}_{ijk}, l_s + l_{jk} + \bar{l}_{sjk}, l_{ij} + l_s + \bar{l}_{ijs}, l_s + l_s + \bar{l}_{sjs})],$$

removing the need for the Boolean variables $g_{ij}(0)$. This approximation is often reasonable because the latencies of the pipeline buffers are usually smaller than the logic and thus the impact is to under-estimate the available free-slack when pipeline buffers are used. This under-estimation can be relatively small when $s_{ij}$ is large because it only impacts the estimate of the free-slack caused by the first and last pipeline buffer of $s_{ij}$.

The resulting MILP is:
Minimize sum $c(s_{ij}) s_{ij}$ subject to
Arrival time constraints: for all channel c between leaf cell instances i and j:

$$a_i = a_j - m\tau + f_{ij} + l_{ij} + f_{ij}' + l_s s_{ij},$$

Free slack constraints: for all channels c between leaf cell instance i and j $$f_{ij} \leq \tau - \tau_{ij}$$

$$f_{ij}' \leq s_{ij}(\tau - \tau_s)$$

Half-buffer slack constraints: for all pairs of channels between leaf cell instance i and j and j and k where leaf cell j is a half-buffer $$f_{ij} + f_{jk} \leq \tau - [\max(l_{ij} + l_{jk} + \bar{l}_{ijk}, l_s + l_{jk} + \bar{l}_{sjk}, l_{ij} + l_s + \bar{l}_{ijs}, l_s + l_s + \bar{l}_{sjs})]$$

Time variable bounds, Boolean, and Integral constraints:
$a_i \geq 0$ for all associated transitions $t_i$,
$f_{ij} \geq 0$, $f_{ij}' \geq 0$, $s_{ij} \in \aleph$ for all channels c between leaf cell instance i and j The optimization result is non-optimal, but with some care the approximation can be conservative in that any result obtained will meet the desired cycle time. Let these modified mixed-buffer constraints be referred to in matrix form as $A_m X_m = b_m$.

Many asynchronous templates also have self-loop delays. These arise from cycles of behavior of a stage that does not involve the evaluation of neighboring stages but still may involve some neighboring completion sensing logic. In this case, the introduction of neighboring slack buffers can reduce these local cycle times.

Rather than complicate our MILP model with additional variables that express these self-loop delays, in particular implementation, these self-loop delays are pre-analyzed and any self-loop delay that violates a target cycle time is further analyzed to determine how the self-loop delay can be reduced. If the introduction of neighboring slack cells will reduce the self-loop delay to meet the delay target, then extra constraints indicating which slack buffers are required should be added to the model. For example, if for a path of cells i, j, k, the self-loop delay of cell j violates the target cycle time, but adding at least one slack buffer between i and j or between j and k solves the problem, then a constraint $s_{ik} + s_{kj} \geq 1$ should be added to the system. If slack buffers are required on both input and output of cell for j's self loop delay to meet the target cycle time along this path, then we would add the two constraints $s_{ij} \geq 1$ and $s_{jk} \geq 1$ to the system. Lastly, if the self loop delay exceeds the target cycle time even if there are faster slack cells around it, then the target cycle time cannot be ever met and this should be reported to the user. In this final case, either this cell must be re-designed or the user must relax the target cycle time.

Our proposed mixed integer linear programs can be solved using the simplex algorithm applied to the relaxed LP problem if all vertices of the feasible solution space are guaranteed to be integral. It is well-known that this happens if and only if the constraint matrix is totally unimodular and the constant matrix is integral. This section proves that with a few modifications our parameterized constraint matrix $A_p$ and $A_m$ meet this property and thus identifies precisely when our MILP framework can be solved using the simplex algorithm.

A square matrix is unimodular if its determinant is +1 or −1. $A_p$ is totally unimodular if and only if every square sub-matrix has determinant 0, 1, or −1. An obvious necessary condition for this to be true is that A must consist of only 0, 1, and −1's. Sufficient conditions for total unimodularity are:

(1) all its entries are either 0, −1 or +1;
(2) any column has at most two nonzero entries; and
(3) the column with two nonzero entries have entries with opposite sign.

Equivalently, (2) and (3) can be phrased in terms of rows.

To see how this prevents the use of linear programming, consider the homogeneous un-balanced fork-join pipeline example with additional slack limited to the output of stage 5. Assume the additional pipeline buffers have a cycle time of 7 giving a free-slack of 3 and expand all equality constraints to pairs of inequalities. The MILP becomes:

Min $s_4$ subject to $$\begin{bmatrix} -1 & 1 & 0 & 0 & 0 & 0 & 0 & 0 \\ 1 & -1 & 0 & 0 & 0 & 0 & 0 & 0 \\ -1 & 0 & 0 & 0 & 0 & 1 & 0 & 0 \\ 1 & 0 & 0 & 0 & 0 & -1 & 0 & 0 \\ 0 & -1 & 1 & 0 & 0 & 0 & 0 & 0 \\ 0 & 1 & -1 & 0 & 0 & 0 & 0 & 0 \\ 0 & 0 & -1 & 1 & 0 & 0 & 0 & 0 \\ 0 & 0 & 1 & -1 & 0 & 0 & 0 & 0 \\ 0 & 0 & 0 & -1 & 1 & 0 & 0 & 0 \\ 0 & 0 & 0 & 1 & -1 & 0 & 0 & 0 \\ 0 & 0 & 0 & 0 & -1 & 1 & -1 & -2 \\ 0 & 0 & 0 & 0 & 1 & -1 & 1 & 2 \\ 1 & 0 & 0 & 0 & -1 & 0 & 0 & 0 \\ -1 & 0 & 0 & 0 & 1 & 0 & 0 & 0 \\ 0 & 0 & 0 & 0 & 0 & 0 & 1 & -3 \end{bmatrix} \begin{bmatrix} a_0 \\ a_1 \\ a_2 \\ a_3 \\ a_4 \\ a_5 \\ f_5 \\ s_5 \end{bmatrix} \leq \begin{bmatrix} -8 \\ 8 \\ -8 \\ 8 \\ 2 \\ -2 \\ 2 \\ -2 \\ 2 \\ -2 \\ 2 \\ -2 \\ 2 \\ -2 \\ 0 \end{bmatrix}$$

where $s_5 \geq 0$, $f_5 \geq 0$, and $a_i \geq 0$ for $i = 0 \ldots 5$, and the integral constraint $s_5 \in \aleph$.

The MILP solution yields the solution $x_p = [8\ 0\ 2\ 4\ 6\ 0\ 2\ 1]$ giving an objective function value of 1 whereas the LP relaxation may yield the solution $x_p = [8\ 0\ 2\ 4\ 6\ 0\ 3\ 2/3]$ giving an objective function value of $2/3$. In this example rounding of the LP relaxed solution leads to the MILP solution, but we do not believe this is true in general.

We now describe an approach to make $A_p$ totally unimodular. The first concern is the latency of the pipeline buffer ($l_s$) cells may not be 1. In fact, in our examples they are assumed to be 2 (which accounts for the two 2's in the matrix above). If the pipeline buffer latency is approximately the same as the leaf cell latency, all leaf cells and pipeline buffers latencies can be normalized to 1. This means that the $b_p$ vector would be normalized by divided it by 2, but if the leaf-cell latencies are all equal and the cycle times are all a multiple of the leaf-cell latencies (as is in our examples), the $b_p$ vector will remain integral. The second concern is that the normalized free-slack coefficient for added pipeline buffers may also not be a 0, 1, or −1. In our case, the normalized free-slack co-efficient is −3 divided by 2 or −3/2. To address this we can approximate the normalized free-slack coefficient in the matrix to be −1. Alternatively, it is possible to omit this term in the free slack constraints and instead take into consideration the additional free-slack of pipeline buffers when instantiating the buffers into the design. For example, if the solver indicates 5 pipeline buffers are needed in some channel, because of the free-slack of buffers it may be possible to use 3 pipeline buffers instead (depending on the relative local cycle times of pipeline buffers and leaf-cells). The slack matching result obtained with this approach is not optimal, however, because the cost function used during minimization does not accurately reflect the cost of the used additional pipeline buffers. We believe, however, that this yields a reasonable approximation.

Assume we take this second approach in which we omit the free-slack coefficient for added pipeline buffers and for convenience assume the first |T| columns of $A_p$ correspond to arrival times, the next |P| columns refer to free slack, and the last |P| columns refer to slack variables. In addition, assume the last |P| rows are used to upper bound the free slack variables. Property (1) is met by $A_p$. Property (2) is not met, however, because a row may have four non-zero entries. When it has four non-zero entries, three will be +1 (the entry for the source arrival time variable, the entry for the free slack variable, and the entry for the slack variable) and one will be −1 (the entry for the destination arrival time variable). We then have:

Theorem 5: The normalized (0, 1, −1) $A_p$ matrix is totally unimodular.

Proof: Proof is by induction on the number of columns coming from columns |T|+1 to |T|+2|P| in the submatrix. If a square submatrix of $A_p$ is taken from the first |T| columns, then all three properties are satisfied, and it is totally unimodular. If a square submatrix of $A_p$ consists of k columns that originally came from columns |T|+1 to |T|+2|P|, then compute the determinant by expanding by minors along a column using Laplace's formula in the range of |T|+1 to |T|+2|P|. Recall this formula states that the determinant is the sum of column entries (having row i and column j) multiplied by the matrix co-factors, where the matrix co-factor is $(-1)^{i+j}$ times the associated matrix minor, i.e., the determinant of the matrix obtained by removing the $i^{th}$ row and $j^{th}$ column. If all entries of the column are 0, the determinant is thus 0. However, in the column there also may be a pair +1, −1 in the column associated with an equality constraint converted to a pair of inequalities. Assume for simplicity that the matrix is organized such that the +1 and −1 elements are in neighboring rows (as in the above example). Both minors may be 0 in which case the overall determinant is 0. Otherwise, the minors must be opposite in sign because the associated matrices only differ by one row that is multiplied by −1. In this case, the two matrix co-factors are equal and the contribution to the overall determinant is again 0. Lastly, there may be a separate +1 in the column that is associated with a free-slack constraint. The contribution to the determinant due to this entry will be the determinant of the matrix with that row and column deleted (possibly inverted in sign depending on the location of the +1). That matrix is also a square submatrix of $A_p$ but it has only k−1 columns that originally came from columns |T|+1 to |T|+2|P|, so by the induction hypothesis, it must have determinant +1, 0, or −1. QED.

Consequently, if we assume the latency of all leaf cells and pipeline buffers are equal and normalize them to 1 and also round the vector b to be integral, the integer linear program can be solved with linear programming techniques which can be very fast (or at least have worst-case polynomial time).

Similar approximations can be used to make the mixed-buffer constraint matrix $A_m$ totally unimodular. The one additional concern that modifications of $A_m$ must account for is the half-buffer constraints on the sum of free-slacks. This additional constraint implies that columns from |T|+1 to |T|+2|P| may have two +1 elements associated with slack variables which invalidates the proof approach for Theorem 5 which relied on only one such +1 element. One approach to resolve this issue is to pre-satisfy these half-buffer constraints by strengthening the constraints on the individual free-slack variables and thus removing the half-buffer constraints from the system. This overly restricts the free-slack in the system bus is conservative.

An alternative but perhaps practical approach to the proposed approximations in both the $A_p$ and $A_m$ systems, is to simply relax the integral restriction on the $s_{ij}$ variables, use an efficient LP solver, round the slack results to the nearest integral number of buffers, and, if necessary, further tune the buffer latencies via transistor sizing or by constraining the physical design placement and/or routing. Finally it is also possible to use standard MILP solutions at the cost of complexity, because, in general, algorithms to solve MILPs have exponential worst-case complexity.

The above-described techniques assume that all leaf-cells are unconditional in nature and consume all input tokens and generated output tokens every cycle. In general, however, leaf cells can conditionally consume and generate data dependent upon internal state and/or the value read upon one or more channels. For these systems, the above approach is an approximation and may add more pipeline buffers than necessary. Several extensions to the above approach that address this issue are discussed below.

One improvement of the above approach is to optimize the slack for different modes of operation in the sequence of their frequency of occurrence. Each mode of operation is associated with a subset of the channels that are active during the mode. The most frequent mode of operation can be slack matched first and the resulting slack on the active channels can be fixed for subsequent modes. Less frequent modes can be given a relaxed throughput target to optimize average throughput. The maximum throughput for the second and any subsequent mode may be limited, however, in order to achieve feasibility.

A second approach is to allow different channels can have different cycle times associated with the most constrained mode of operation in which they are active. This is also non-optimum because the free-slack for less frequent cycles (i.e., modes) of operation is under estimated when it shares channels active in other cycles (i.e., modes) with more restrictive frequency targets.

A third approach is to create different time and slack variables $a_{i,m}$ and $f_{c,m}$ for each different operation mode m for all channels that are active in this mode. In this way each operation mode would have its own set of variables that must be solved that uses a mode-dependent frequency target $\tau_m$ instead of $\tau$. The set of slack variables $s_c$ however would not change because the set of constraints for each mode of operation must all be satisfied with the same amount of slack on each channel. This approach is closer to optimal that the first two approaches because the free-slack of each mode of operation is accurately modeled, but has the disadvantage that the complexity of the MILP formulation grows linearly with the number of modes considered. It is still not necessarily optimal, however, because it does not model transient performance bottlenecks associated with changing between modes.

While the invention has been particularly shown and described with reference to specific embodiments thereof, it will be understood by those skilled in the art that changes in the form and details of the disclosed embodiments may be made without departing from the spirit or scope of the invention. To reiterate, at least some of the slack matching techniques described herein have been described with reference to a technique for transforming the output of a synchronous logic synthesis CAD tool to an asynchronous design. However, it should be again noted that the slack matching techniques of the present invention are more generally applicable and may be employed in the optimization of any of a wide variety of asynchronous slack-elastic systems and latency-insensitive designs. This includes many quasi-delay-insensitive designs.

This invention has introduced a number of mathematical models of the circuit that capture its performance and its parameterized performance as a function of the slack added to the circuits. We represented models with half, full, and mixed buffers with a variety of degrees of complexity and detail. By removing the slack variables, each of the models reduces to a simpler model describing the timing properties of the un-optimized circuit, which can be used for performance analysis. Specifically, any of the formulations can be converted into an LP performance analysis problem by eliminating all $s_{ij}$ variables from the constraints (i.e. fixing them to zero) and then minimizing the objective function $\tau$. The minimized $\tau$ is the circuit's worst-case cycle metric.

In addition, although various advantages, aspects, and objects of the present invention have been discussed herein with reference to various embodiments, it will be understood that the scope of the invention should not be limited by reference to such advantages, aspects, and objects. Rather, the scope of the invention should be determined with reference to the appended claims.

What is claimed is:

1. A computer-implemented method for optimizing a circuit design, comprising:
generating a gate level circuit description corresponding to the circuit design, the gate level circuit description comprising a plurality of pipelines across a plurality of levels, the plurality of pipelines including a first pipeline comprising two paths which diverge at a fork stage and converge at a join stage; and
using a linear programming technique, adding a first number of buffers to selected stages of the pipelines such that the pipelines are balanced, at least one performance constraint is satisfied, an objective function characterizing the circuit design is minimized, and each pipeline has at least one gate in each pipeline stage through which it passes, wherein the two paths of the first pipeline include different numbers of cells.

2. The method of claim 1 wherein the linear programming technique employs real and integer variables subject to linear constraints.

3. The method of claim 2 wherein the objective function is one of linear and nonlinear.

4. The method of claim 2 wherein the linear programming technique comprises one of an integer linear programming (ILP) technique, a mixed-integer linear programming (MILP) technique, or a linear programming (LP) technique.

5. The method of claim 1 wherein the gate level circuit description comprises a hierarchical description comprising leaf cells, mid-level cells, and channels interconnecting the leaf cells and the mid-level cells, the channels having channel cycle times associated therewith, and wherein adding the first number of buffers comprises formulating a mixed integer linear programming (MILP) formulation with reference to the hierarchical description and a target cycle time, and solving the MILP formulation using an MILP solver to identify where the first number of buffers should be added to the circuit design.

6. The method of claim 1 further comprising converting the linear programming technique to perform a performance analysis of the circuit design.

7. The method of claim 1 wherein the circuit design comprises one of asynchronous multi-level domino logic and latency-insensitive synchronous logic.

8. The method of claim 1 wherein the circuit design comprises a slack-elastic asynchronous system.

9. The method of claim 1 wherein adding the first number of buffers comprises adding a second number of buffers to balance the pipelines to achieve a performance target, and removing selected ones of the second number of buffers while still substantially achieving the performance target.

10. The method of claim 1 wherein the objective function comprises at least one of throughput, area, power dissipation, cost of additional leaf cell types, and a total number of buffers.

11. The method of claim 1 wherein the circuit design has a plurality of modes of operation, each mode of operation corresponding to a subset of the pipelines being active during the corresponding mode, and wherein application of the linear programming technique to add the first number of buffers is done considering all modes of operation.

12. The method of claim 11 wherein each of the modes of operation has a corresponding frequency of occurrence, and wherein successive application of the linear programming technique for the modes of operation is done in order of the frequency of occurrence associated with each.

13. The method of claim 12 wherein a result of a previous application of the linear programming technique for a corresponding one of the modes of operation is used as input for a subsequent application of the linear programming technique for another one of the modes of operation.

14. The method of claim 13 wherein the performance constraint comprises an average of a plurality of performance constraints each of which is associated with application of the linear programming technique for a corresponding one of the modes of operation.

15. The method of claim 14 wherein the performance constraint associated with a first one of the modes of operation is relaxed with respect to the performance constraint associated with a second one of the modes of operation, application of the linear programming technique for the first mode of operation being subsequent to application of the linear programming technique for the second mode of operation.

16. The method of claim 14 wherein a selected one of the pipelines is active in more than one of the modes of operation, and wherein application of the linear programming technique for each of the more than one of the modes of operation employs a cycle time for the selected pipeline which is associated with a most constrained one of the more than one of the modes of operation.

17. The method of claim 14 wherein a subset of the pipelines is active in more than one of the modes of operation, and wherein application of the linear programming technique for each of the more than one of the modes of operation employs independent token arrival time variables to model time behavior for each of the more than one of the modes of operation.

18. The method of claim 1 wherein the gate level circuit description comprises at least one of a plurality of full-buffer asynchronous cells and a plurality of half-buffer asynchronous cells.

19. The method of claim 1 wherein the linear programming technique models free slack in each channel in the pipelines such that a local cycle time of each channel meets the at least one performance constraint.

20. The method of claim 1 wherein the linear programming technique constrains arrival times of tokens at asynchronous leaf cells in the pipeline stages such that modeled time behavior of the circuit design includes delay associated with the asynchronous leaf cells.

21. The method of claim 1 wherein the linear programming technique employs a mathematically equivalent representation of modeling free slack in each channel in the pipelines such that a local cycle time of each channel meets the at least one performance constraint.

22. The method of claim 1 wherein the linear programming technique employs a mathematically equivalent representation of constraining arrival times of tokens at asynchronous leaf cells in the pipeline stages such that modeled time behavior of the circuit design includes delay associated with the asynchronous leaf cells.

23. At least one computer-readable medium having data structures stored therein resulting from the method of claim 1 and representative of the circuit.

24. The at least one computer-readable medium of claim 23 wherein the data structures comprise a simulatable representation of the circuit.

25. The at least one computer-readable medium of claim 24 wherein the simulatable representation comprises a netlist.

26. The at least one computer-readable medium of claim 23 wherein the data structures comprise a code description of the circuit.

27. The at least one computer-readable medium of claim 26 wherein the code description corresponds to a hardware description language.

* * * * *

UNITED STATES PATENT AND TRADEMARK OFFICE
CERTIFICATE OF CORRECTION

| | | |
|---|---|---|
| PATENT NO. | : 7,584,449 B2 | Page 1 of 1 |
| APPLICATION NO. | : 11/271323 | |
| DATED | : September 1, 2009 | |
| INVENTOR(S) | : Beerel et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 244 days.

Signed and Sealed this
Fifteenth Day of February, 2011

David J. Kappos
*Director of the United States Patent and Trademark Office*